US012489101B2

(12) United States Patent
Lee et al.

(10) Patent No.: US 12,489,101 B2
(45) Date of Patent: Dec. 2, 2025

(54) ELECTRONIC DEVICES HAVING INNER ELECTRONIC COMPONENT INTERPOSED BETWEEN SUBSTRATES AND METHOD OF MANUFACTURING THE SAME

(71) Applicant: Amkor Technology Singapore Holding Pte. Ltd., Valley Point (SG)

(72) Inventors: Sang Hyeon Lee, Incheon (KR); Kyoung Yeon Lee, Incheon (KR); Jae Beom Shim, Incheon (KR); Yi Seul Han, Incheon (KR); Ji Yeon Ryu, Incheon (KR); Woo Jun Kim, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 457 days.

(21) Appl. No.: 17/994,355

(22) Filed: Nov. 27, 2022

(65) Prior Publication Data

US 2024/0178206 A1     May 30, 2024

(51) Int. Cl.
*H01L 25/16* (2023.01)
*G02B 6/42* (2006.01)
(Continued)

(52) U.S. Cl.
CPC .......... *H01L 25/167* (2013.01); *G02B 6/4257* (2013.01); *G02B 6/426* (2013.01);
(Continued)

(58) Field of Classification Search
CPC ... H01L 25/167; H01L 21/4853; H01L 23/13; H01L 23/49816; H01L 23/49822;
(Continued)

(56) References Cited

U.S. PATENT DOCUMENTS

2016/0358889 A1\* 12/2016 Lai .................. H01L 21/768
2017/0365587 A1\* 12/2017 Hung .............. H01L 21/486
(Continued)

OTHER PUBLICATIONS

Shinko Electric Industries Co., Ltd.; Device Embedded Package MCep; https://www.shinko.co.jp/english/product/package/assembly/mcep.php; downloaded Aug. 27, 2022; 6 pages.
(Continued)

*Primary Examiner* — Michael Jung
(74) *Attorney, Agent, or Firm* — Kevin B. Jackson

(57) ABSTRACT

In one example, an electronic device includes a first substrate and a second substrate. The first substrate includes a substrate first side, a substrate second side, and a first conductive structure. An inner electronic component is coupled to the first conductive structure proximate to the substrate second side. An outer electronic component is coupled to the first conductive structure proximate to the substrate first side. The outer electronic component includes a body and a groove in the body configured to couple with an external interconnect. Inner interconnects couple the first substrate to the second substrate. The first substrate, the second substrate, the inner electronic component, and the outer electronic component are in a stacked configuration. The inner electronic component is interposed between the first substrate and the second substrate. Other examples and related methods are also disclosed herein.

20 Claims, 21 Drawing Sheets

(51) Int. Cl.
*H01L 21/48* (2006.01)
*H01L 23/00* (2006.01)
*H01L 23/13* (2006.01)
*H01L 23/498* (2006.01)

(52) U.S. Cl.
CPC ........... *G02B 6/4262* (2013.01); *G02B 6/428* (2013.01); *H01L 21/4853* (2013.01); *H01L 23/13* (2013.01); *H01L 23/49816* (2013.01); *H01L 23/49822* (2013.01); *H01L 23/49833* (2013.01); *H01L 23/49838* (2013.01); *H01L 24/16* (2013.01); *H01L 24/32* (2013.01); *H01L 24/73* (2013.01); *H01L 2224/16227* (2013.01); *H01L 2224/32225* (2013.01); *H01L 2224/73204* (2013.01); *H01L 2924/1616* (2013.01); *H01L 2924/16195* (2013.01); *H01L 2924/16235* (2013.01); *H01L 2924/16251* (2013.01); *H01L 2924/1632* (2013.01); *H01L 2924/182* (2013.01)

(58) Field of Classification Search
CPC ......... H01L 23/49833; H01L 23/49838; H01L 24/16; G02B 6/4257; G02B 6/426; G02B 6/4262; G02B 6/428
See application file for complete search history.

(56) References Cited

U.S. PATENT DOCUMENTS

2021/0223489 A1* 7/2021 Weng ...................... H01L 24/16
2022/0196942 A1* 6/2022 Pratap .................. G02B 6/4292
2022/0342150 A1* 10/2022 Karhade ............. G02B 6/12002
2023/0307404 A1* 9/2023 Kuo ........................ H01L 24/14

OTHER PUBLICATIONS

Shinko Electric Industries Co., Ltd.; DMCeP—Device Embedded Package Data Sheet; https://www.shinko.co.jp/english/product/package/assembly/mcep.php; downloaded Aug. 27, 2022; 1 page.

* cited by examiner

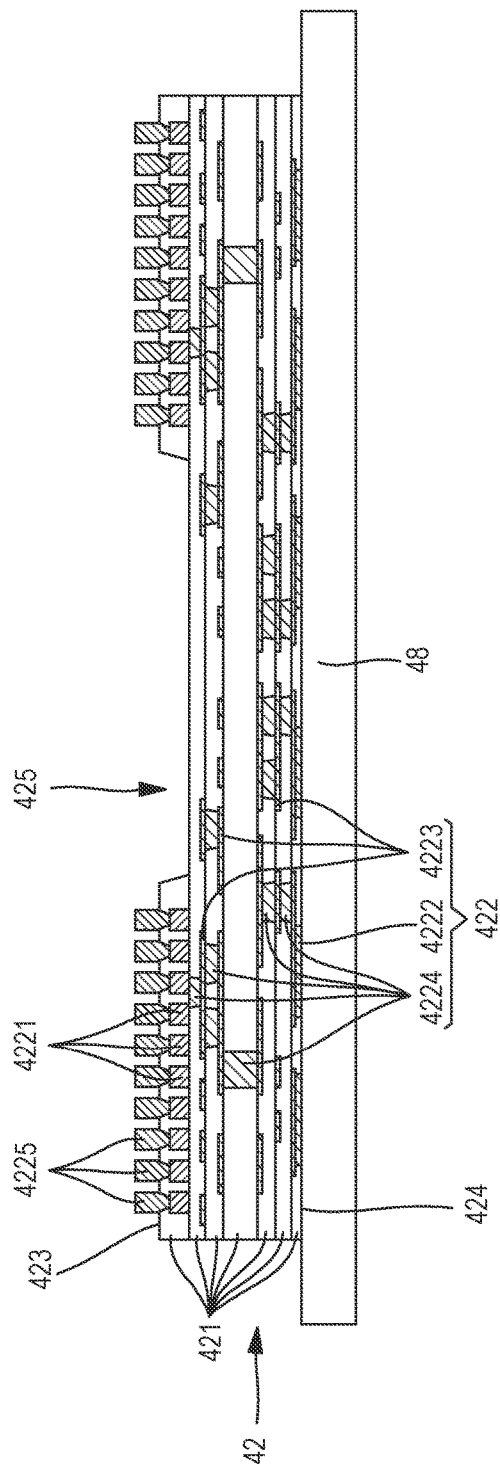
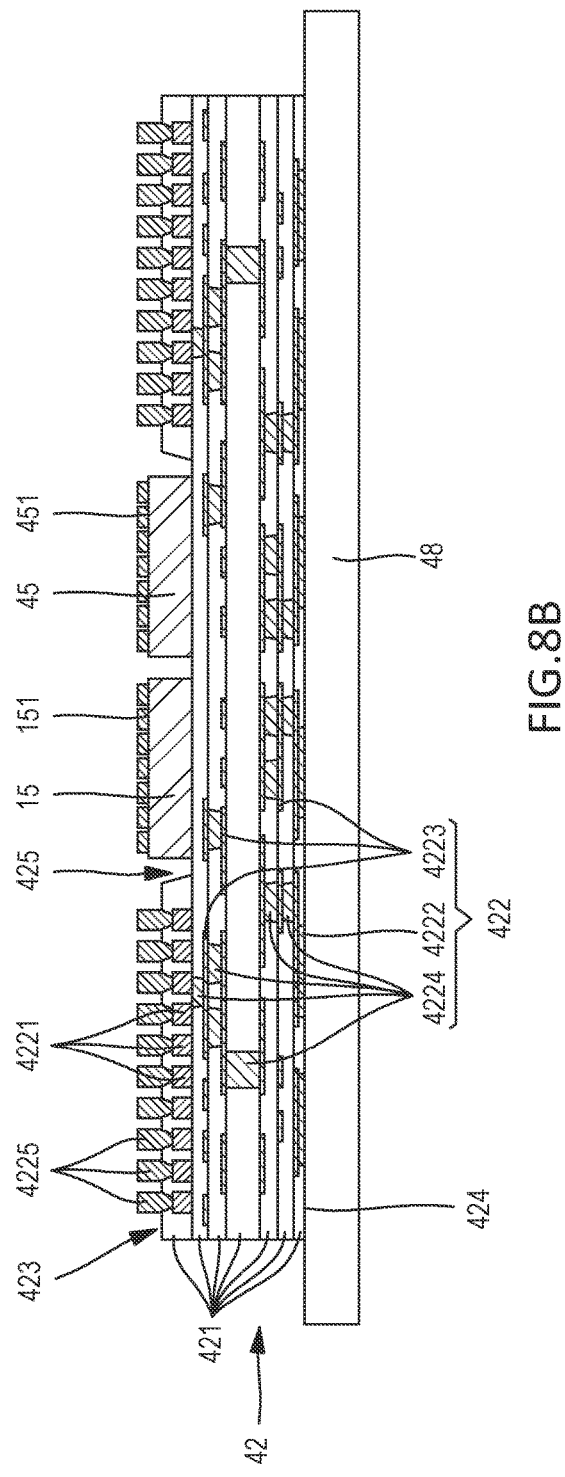
FIG.8A
FIG.8B

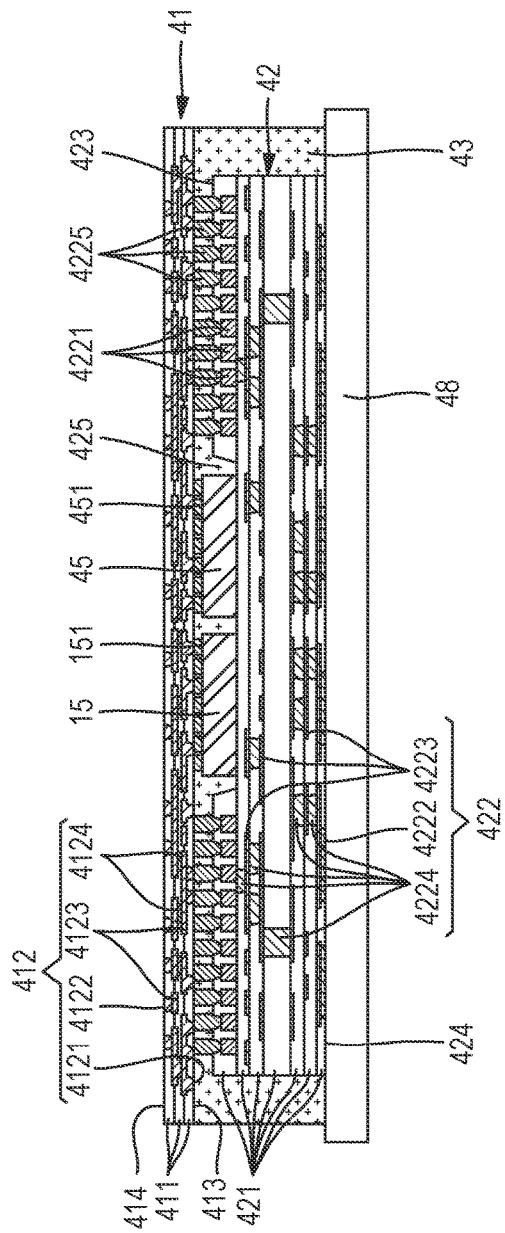
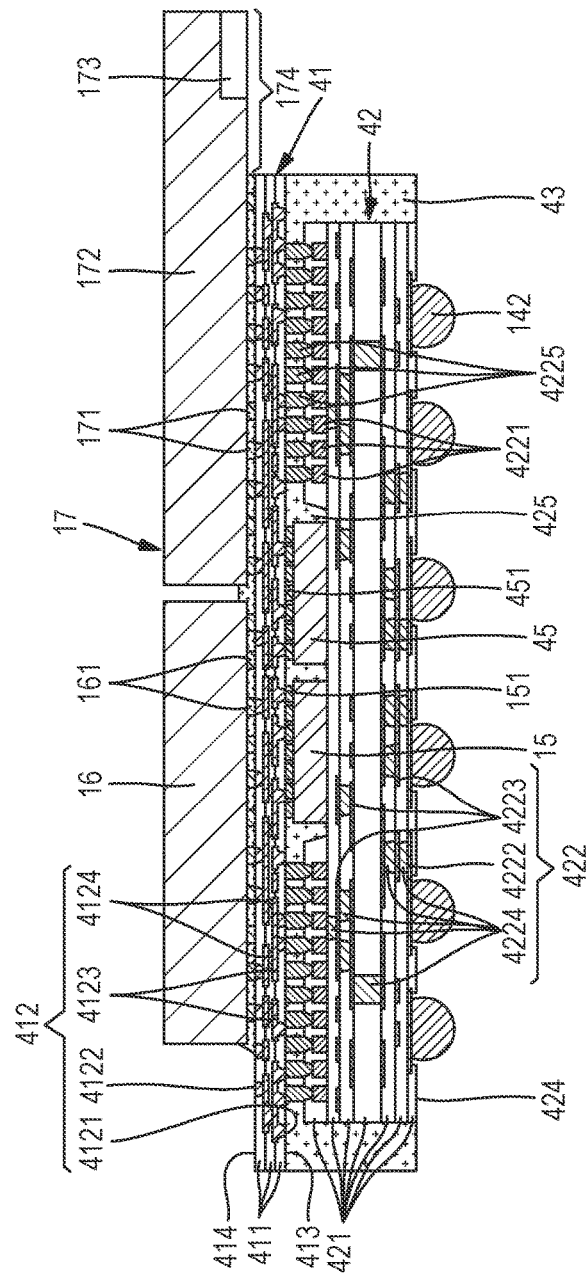
FIG.8E
FIG.8F

ELECTRONIC DEVICES HAVING INNER ELECTRONIC COMPONENT INTERPOSED BETWEEN SUBSTRATES AND METHOD OF MANUFACTURING THE SAME

CROSS-REFERENCE TO RELATED APPLICATIONS

Not applicable.

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, resulting, for example, in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIGS. 8A, 8B, 8C, 8D, 8E, 8F, and 8G show cross-sectional views of an example method for manufacturing an example electronic device.

Figure 1:
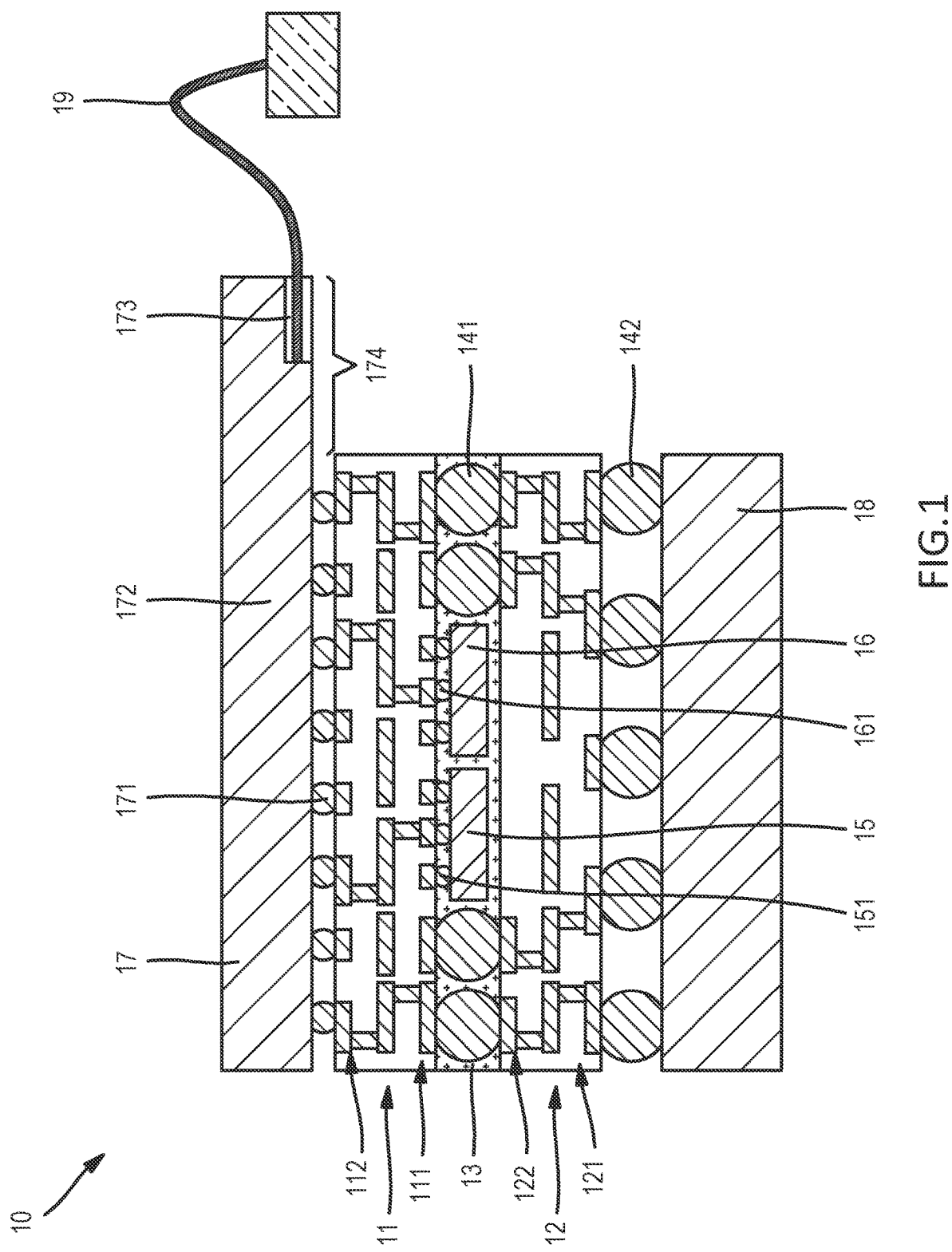
FIG. 1 shows a cross-sectional view of an example electronic device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. Crosshatching lines may be used throughout the figures to denote different parts but not necessarily to denote the same or different materials. Throughout the present disclosure, like reference numbers denote like elements. Accordingly, elements with like element numbering may be shown in the figures but may not be necessarily repeated herein for the sake of clarity.

The term "or" means any one or more of the items in the list joined by "or." As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$.

The terms "comprises," "comprising," "includes," and "including," are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. As used herein, the term coupled can refer to an electrical coupling or a mechanical coupling. Similarly, the terms "over" or "on" may be used to describe two elements directly contacting each other or describe two elements indirectly connected by one or more other elements.

DESCRIPTION

The present description includes, among other features, structures and associated methods that relate to electronic devices with high density 3D interconnect configurations. In some examples, multiple electronic components are integrated with a substrate interposer in a stacked or package-on-package (POP) configuration. In some examples, multiple substrates are used to increase integration and functionality. In some examples, an outer electronic component is coupled to an outer side of substrate interposer and is configured as photonic integrated circuit (PIC) adapted as a transceiver for optical signals. In some examples, inner electronic components are coupled to an inner side of the substrate interposer and can be configured to process the optical signals from the PIC component. Various configurations are described for coupling, interconnecting, and protecting the electronic components. Among other things, the structures and methods support high density interconnection for high-speed interfacing between multiple electronic components in a reduced body size. The structures and methods are suitable for any electronic devices benefitting from such features.

In an example, an electronic device includes a first substrate includes a first substrate first side, a first substrate second side opposite the first substrate first side, a first dielectric structure, and a first conductive structure; and a second substrate includes a second substrate first side and a second substrate second side opposite the second substrate first side. A first inner electronic component is coupled to the first conductive structure proximate to the first substrate second side. An outer electronic component is coupled to the first conductive structure proximate to the first substrate first side. The outer electronic component includes a body and a groove in the body configured to couple with an external interconnect. Inner interconnects couple the first substrate to the second substrate. The first substrate, the second substrate, the first inner electronic component, and the outer electronic component are in a stacked configuration. The first inner electronic component is interposed between the first substrate and the second substrate.

In an example, an electronic device includes a first substrate including a first substrate inner side, a first substrate outer side opposite the first substrate inner side, a first substrate edge, a first dielectric structure, and a first conductive structure; and a second substrate including a second substrate inner side, a second substrate outer side opposite the second substrate inner side, a second dielectric structure, and a second conductive structure; A first electronic component includes a first active side and a first back side opposite to the first active side, and the first active side is coupled to the first conductive structure proximate to the first substrate inner side. A second electronic component includes a second active side and a second back side opposite to the second active side, and the second electronic component is adjacent to the first electronic component. An optical component is coupled to the first conductive structure adjacent to the first substrate outer side. The optical component includes a body, a ledge portion that extends beyond the first substrate edge, and a wave guide in the ledge portion. Inner interconnects coupled the first substrate inner side to the second substrate inner side. The optical component, the first substrate, and the second substrate are in a stacked configuration. The first electronic component and the second electronic component are interposed between the first substrate and the second substrate.

In an example, a method of manufacturing an electronic device includes providing a first substrate comprising a first substrate inner side, a first substrate outer side opposite the first substrate inner side, a first substrate edge, a first dielectric structure, and a first conductive structure. The method includes providing a second substrate comprising a second substrate inner side, a second substrate outer side opposite the second substrate inner side, a second dielectric structure, and a second conductive structure. The method includes providing a first electronic component comprising a first active side. The method includes coupling the first active side to the first conductive structure adjacent to the first substrate inner side. The method includes coupling the first substrate inner side to the second substrate inner side with inner interconnects. The method includes coupling an optical component to the first conductive structure adjacent to the first substrate outer side, the optical component comprising a body, a ledge portion that extends beyond the first substrate edge, and a wave guide in the ledge portion and configured to couple with an optical interconnect. The method provides the optical component, the first substrate and the second substrate in a stacked configuration, and the first electronic component interposed between the first substrate and the second substrate.

Other examples are included in the present disclosure. Such examples may be found in the figures, in the claims, or in the description of the present disclosure.

FIG. 1 shows a cross-sectional view of an example electronic device 10. In the example shown in FIG. 1, electronic device 10 can comprise substrate 11, substrate 12, encapsulant 13, inner interconnects 141, outer interconnects 142, electronic component 15, electronic component 16, and electronic component 17. In some examples, electronic device 10 may also include base substrate 18. In some examples, electronic device 10 may also include optical interconnect 19.

Substrate 11 can comprise dielectric structure 111 and conductive structure 112. Substrate 12 can comprise dielectric structure 121 and conductive structure 122. Electronic component 15 can comprise component interconnects 151. Electronic component 16 can comprise component interconnects 161. Electronic component 17 can comprise component interconnects 171, body 172, groove 173, and ledge portion 174.

Substrates 11 and 12, encapsulant 13, internal interconnects 141, and outer interconnects 142 can be referred to as an electronic package or a package, which can protect electronic components 15 and 16 from external elements or environmental exposure. In some examples, substrates 11 and 12, encapsulant 13, internal interconnects 141, outer interconnects 142, and electronic components 15, 16 and 17 can be referred to as a COP (Co-Packaged Optics) and can provide coupling to external electrical components through optical interconnect 19.

Figure 2A:
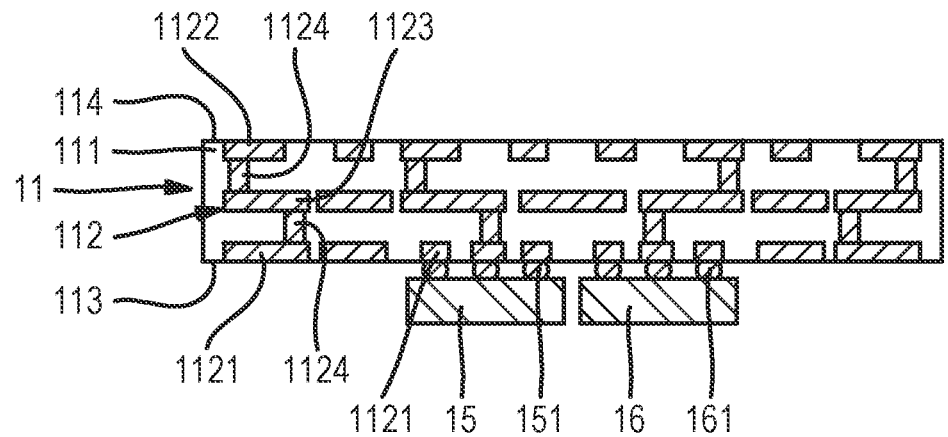
FIGS. 2A, 2B, 2C, 2D, 2E, 2F, and 2G show cross-sectional views of an example method for manufacturing an example electronic device.

FIGS. 2A to 2G show cross-sectional views of an example method for manufacturing electronic device 10. FIG. 2A shows a cross-sectional view of electronic device 10 at an early stage of manufacture. In the example shown in FIG. 2A, substrate 11 and electronic components 15 and 16 can be provided. Substrate 11 can comprise or be referred to as an interposer, a silicon interposer, a glass interposer, an organic interposer, a rigid printed circuit board, a flexible printed circuit board, a laminate substrate, a redistribution layer (RDL) substrate, a coreless substrate, a ceramic substrate, a glass substrate, a silicon substrate, or a package substrate. In some examples, the thickness of substrate 11 can range from approximately 20 micrometers (μm) to approximately 2000 μm. Substrate 11 can couple electronic components 15 and 16 to each other or to an external device and can protect electronic components 15 and 16 from external environments.

Substrate 11 can comprise dielectric structure 111 and conductive structure 112. Substrate 11 can also comprise substantially planar substrate inner (or bottom) side 113 and substantially planar substrate outer (or top) side 114, which is opposite substrate inner side 113. Electronic components 15 and 16 can be coupled to substrate inner side 113.

Dielectric structure 111 can comprise or be referred to as one or more dielectric layers. Dielectric structure 111 can comprise silicon, glass, an organic material, FR4 (a laminate of copper foil-glass fiber fabric-copper foil), BT (bismaleimide triazine), polyimide (PI), benzocyclobutene (BCB), polybenzoxazole (PBO), or ceramic. In some examples, the thickness of dielectric structure 111 can range from approximately 3 μm to approximately 100 μm. In some examples, the thickness of dielectric structure 111 can refer to thicknesses of individual layers of dielectric structure 111. In some examples, the combined thickness of all layers of dielectric structure 111 can be similar to or equal to the thickness of substrate 11. Dielectric structure 111 can maintain the shape of substrate 11 and can also support conductive structure 112.

Conductive structure 112 can comprise or be referred to as one or more conductive layers, traces, pads, patterns, or under bumped metallization (UBM). Conductive structure 112 can comprise copper, aluminum, gold, silver, nickel, palladium, or an alloy. In some examples, the thickness of conductive structure 112 can range from approximately 3 μm to approximately 50 μm. In some examples, the thickness of conductive structure 112 can refer to thicknesses of individual layers of conductive structure 112. In some examples, the combined thickness of all layers of conductive structure 112 can be similar to or equal to the thickness of substrate 11. Conductive structure 112 can provide electrical signal paths (e.g., vertical paths and/or horizontal paths) for electronic components 15, 16, and 17.

Conductive structure 112 can comprise inner terminals 1121, outer terminals 1122, embedded traces 1123, and embedded vias 1124. Inner terminals 1121 can be provided on the inner side of dielectric structure 111 (e.g., along substrate inner side 113). Inner terminals 1121 can be exposed from dielectric structure 111. Inner terminals 1121 can be coupled to embedded traces 1123 or embedded vias 1124. Inner terminals 1121 can comprise or be referred to as traces, bond fingers, lands, or pads. Inner terminals 1121 can comprise copper, aluminum, gold, silver, nickel, palladium, or an alloy. In some examples, the thicknesses of inner terminals 1121 can range from approximately 3 µm to approximately 50 µm. Electronic components 15 and 16 can be coupled to inner terminals 1121.

Outer terminals 1122 can be provided on the outer side of dielectric structure 111 (e.g., along substrate outer side 114). Outer terminals 1122 can be exposed from dielectric structure 111. Outer terminals 1122 can be coupled to embedded traces 1123 or embedded vias 1124. Outer terminals 1122 can comprise or be referred to as traces, bond fingers, lands, or pads. Outer terminals 1122 can comprise copper, aluminum, gold, silver, nickel, palladium, or an alloy. In some examples, the thicknesses of outer terminals 1122 can range from approximately 3 µm to approximately 50 µm. In some examples, electronic component 17 (FIG. 2F) can be coupled to outer terminals 1122.

Embedded traces 1123 can extend in a substantially horizontal direction inside dielectric structure 111. Embedded traces 1123 provide electrical connection paths in an approximately horizontal direction in dielectric structure 111, and can be coupled to inner terminals 1121, outer terminals 1122, or embedded vias 1124. In some examples, the thicknesses of embedded traces 1123 can range from approximately 3 µm to approximately 50 µm. Embedded vias 1124 can extend in a substantially vertical direction inside dielectric structure 111. Embedded vias 1124 provide electrical connection paths in an approximately vertical direction in dielectric structure 111, and can be coupled to inner terminals 1121, outer terminals 1122, or embedded traces 1123. In some examples, the width (or diameter) of embedded vias 1124 can range from approximately 3 µm to approximately 100 µm.

Substrate 11 may be produced in a variety of ways. In some examples, taking a silicon wafer as an example, substrate 11 can be formed through the steps of: providing a through hole in the silicon wafer; providing an insulating layer on the surface of the silicon wafer; providing a seed layer on the surface of the insulating layer; providing a through electrode by plating a conductive material until the through hole is filled on the seed layer; providing a conductive layer on the surface of the silicon wafer to be connected to the through electrode and providing a conductor pattern through a photo process and an etching process; providing an insulating layer (e.g., a silicon oxide film or a silicon nitride film) on the conductor pattern; and removing a portion of the insulating layer to expose a portion of the conductor pattern. In some examples, these steps can be repeated several times, thereby providing a multilayer silicon interposer.

In some examples, taking a two-layer FR4 substrate as an example, substrate 11 can be produced by the steps of: processing a drill hole to connect a lower copper foil and an upper copper foil, performing electroplating on the drill hole to electrically connect the lower copper foil and the upper copper foil; patterning an outer layer circuit including inner terminals and outer terminals on the inner side (lower surface) and outer side (upper surface) of the substrate by providing a photosensitive film on the substrate surface and photo-etching the photosensitive film so the surfaces of the lower copper foil and the upper copper foil are patterned; providing a seed layer for plating, which is thinner than the outer circuit by performing electroless plating on the entire upper and lower surfaces of the substrate to cover the outer circuit; providing a photosensitive film on the seed layer for plating to cover the seed layer for plating, and photo-etching the photosensitive film to pattern the seed layer for plating; providing a solder resist layer over the entire upper and lower surfaces of the substrate so the outer circuit is exposed; and forming a plating layer on the outer circuit including inner terminals and outer terminals exposed outside of the solder resist layer by applying electricity to the plating seed layer.

In some examples, in the case of a three- to six-layer substrate, having layers more than the two-layer substrate, substrate 11 can be provided by providing the steps of providing an inner-layer circuit and laminating, in addition to the above-described steps. As an example, the step of providing the inner layer circuit can be performed by photo-etching the photosensitive film so the surfaces of the upper copper foil and the lower copper foil are patterned for each substrate, thereby patterning the inner layer circuit on the lower surface and upper surface of each substrate. As an example, the laminating step can be performed by aligning each of the provided substrates as described above and allowing each of the substrates to be integrated into one substrate while providing predetermined temperature and pressure. In some examples, the dielectric structure can be a B-stage prepreg, and, after the laminating step, the dielectric structure can be in a C-stage state, and thus each substrate can be integrated, thereby providing a multilayer substrate. In some examples, after the laminating step, a hole processing step, a plating step, a step of providing an outer layer circuit, etc., can be sequentially provided in a similar manner as described above.

In some examples, substrate 11 can be a pre-formed substrate. Pre-formed substrates can be manufactured prior to attachment to an electronic device and can comprise dielectric layers between respective conductive layers. The conductive layers can comprise, for example, copper and can be formed using an electroplating process. The dielectric layers can be non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT) or FR4, and dielectric and conductive layers can be formed on the permanent core structure. In other examples, the pre-formed substrate can be a coreless substrate omitting the permanent core structure, and the dielectric and conductive layers can be formed on a sacrificial carrier that is removed after formation of the dielectric and conductive layers and before attachment to the electronic device. The pre-formed substrate can rereferred to as a printed circuit board (PCB) or a laminate substrate. Such pre-formed substrates can be formed through a semi-additive or modified-semi-additive process. Substrates in this disclosure can comprise pre-formed substrates.

In some examples, substrate 11 can be a RDL substrate. RDL substrates can comprise one or more conductive redistribution layers and one or more dielectric layers and (a) can be formed layer by layer over an electronic device to which the RDL substrate is to be coupled, or (b) can be formed layer by layer over a carrier and then entirely removed or at least partially removed after the electronic device and the RDL substrate are coupled together. RDL substrates can be manufactured layer by layer as a wafer-level substrate on a round wafer in a wafer-level process, and/or as a panel-level substrate on a rectangular or square panel carrier in a panel-level process. RDL substrates can be formed in an additive buildup process and can include one or more dielectric layers alternatingly stacked with one or more conductive layers and define respective conductive redistribution patterns or traces configured to collectively (a) fan-out electrical traces outside the footprint of the electronic device, and/or (b) fan-in electrical traces within the footprint of the electronic device. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layer(s) can comprise silicon nitride ($Si_3N_4$), silicon oxide ($SiO_2$), or silicon oxynitride (SiON). The inorganic dielectric layer(s) can be formed by growing the inorganic dielectric layers using an oxidation or nitridization process rather than using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate. Substrates in this disclosure can comprise RDL substrates.

Electronic components 15 and 16 can be coupled to substrate 11. Electronic components 15 and 16 can each comprise an active side and an inactive side (also referred to as a back side or component back side) opposite the active side. The active side can face the inner side of substrate 11. Electronic components 15 and 16 can comprise component interconnects 151 and 161, respectively. Component interconnects 151 and 161 can comprise or be referred to as bumps, SnPb bumps, lead free bumps, copper posts, copper pillars, stud bumps, or pads.

Electronic components 15 and 16 can be coupled to inner terminals 1121 of substrate 11 via component interconnects 151 and 161, respectively. In some examples, component interconnects 151 and 161 of electronic components 15 and 16 can be coupled to inner terminals 1121 of substrate 11 by a reflow process, a thermal ultrasonic compression process, or a laser assisted bonding process. Electronic components 15 and 16 can each comprise or be referred to as a semiconductor die, a semiconductor chip, a semiconductor package, a semiconductor device, an active component, or a passive component. The electronic components 15 and 16 can also comprise or be referred to as an electronic integrated circuit (EIC), a clock data recovery (CDR), a power management integrated circuit (PMIC), a digital signal processor (DSP), a network processor, an audio processor, a wireless baseband system-on-chip processor, a sensor, an application specific integrated circuit, a memory, or an integrated passive device (IPD). In some examples, electronic component 15 can be an EIC and electronic component 16 can be a CDR. In some examples, the thicknesses of electronic components 15 and 16 can range from approximately 40 μm to approximately 1000 μm. In some examples, electronic components 15 and 16 can perform various calculation and control processing, store data, or remove noise from an electrical signal. In some examples, electronic components 15 and 16 are examples of inner electronic components.

Figure 2B:
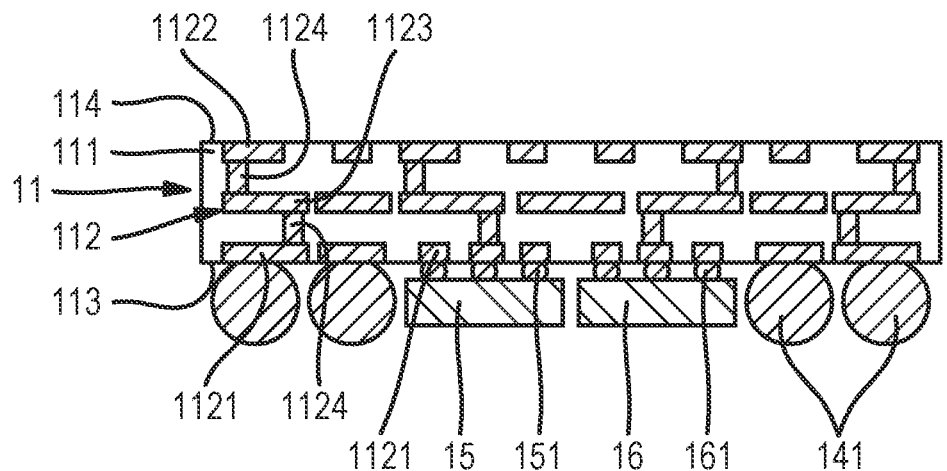

FIG. 2B shows a cross-sectional view of electronic device 10 at a later stage of manufacture. In the example shown in FIG. 2B, inner interconnects 141 can be provided. Inner interconnects 141 can be coupled to inner terminals 1121 of substrate 11. In some examples, after inner interconnects 141 are dropped on inner terminals 1121 of substrate 11, a reflow process can be performed or a laser beam can be irradiated and then cooled, thereby coupling inner interconnects 141 onto inner terminals 1121. Inner interconnects 141 can comprise or be referred to as solder balls, solder-coated metal (Cu)-core balls, pillars, bumps, pins, or vertical wire bonds. In some examples, the thicknesses of inner interconnects 141 can range from approximately 50 μm to approximately 1000 μm.

Figure 2C:
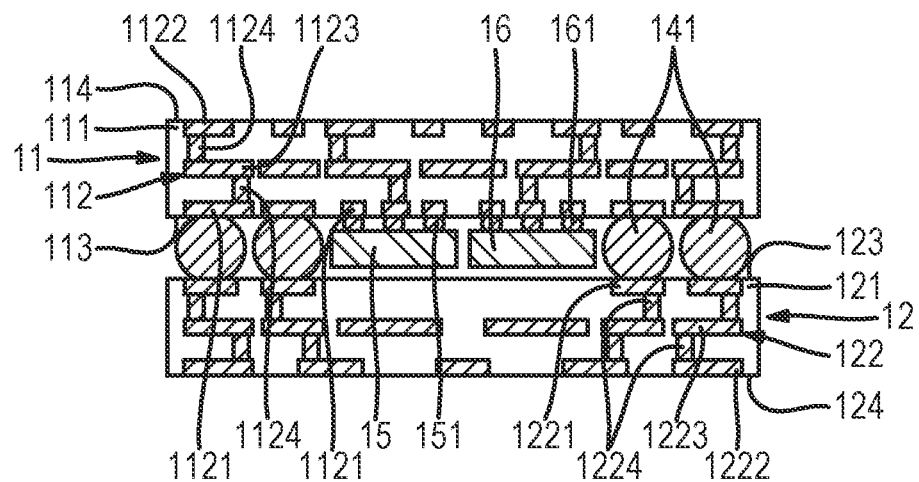

FIG. 2C shows a cross-sectional view of electronic device 10 at a later stage of manufacture. In the example shown in FIG. 2C, substrate 12 can be provided. In some examples, substrate 12 can be similar to substrate 11 described above. In some examples, substrate 12 can comprise or be referred to as rigid printed circuit board, a flexible printed circuit board, a laminate substrate, a pre-formed substrate, a RDL substrate, a coreless substrate, a ceramic substrate, a glass substrate, a silicon substrate, or a package substrate. In some examples, the thickness of substrate 12 can range from approximately 20 μm to approximately 2000 μm. Substrate 12 can couple inner interconnects 141 to each other or to an external device.

Substrate 12 can comprise dielectric structure 121 and conductive structure 122. Substrate 12 can comprise substantially planar substrate inner side 123 and substantially planar substrate outer side 124 opposite substrate inner side 123. Inner interconnects 141 can be coupled to substrate inner side 123. Inner interconnects 141 can couple substrate 11 to substrate 12.

Dielectric structure 121 can comprise or be referred to as one or more dielectric layers. In some examples, the thickness of dielectric structure 121 can range from approximately 3 µm to approximately 100 µm. Conductive structure 122 can comprise or be referred to as one or more conductive layers, traces, pads, patterns, or under bumped metals (UBMs). In some examples, the thickness of conductive structure 122 can range from approximately 3 µm to approximately 50 µm.

Conductive structure 122 can comprise inner terminals 1221, outer terminals 1222, embedded traces 1223, and embedded vias 1224. Inner terminals 1221 can be provided on the inner side of dielectric structure 121 (e.g., along substrate inner side 123). Inner terminals 1221 can be exposed from dielectric structure 121. Inner terminals 1221 can be coupled to embedded traces 1223 or embedded vias 1224. Inner terminals 1221 can comprise or be referred to as traces, bond fingers, lands, or pads. Inner terminals 1221 can comprise copper, aluminum, gold, silver, nickel, palladium, or an alloy. In some examples, the thicknesses of inner terminals 1221 can range from approximately 3 µm to approximately 50 µm. Inner interconnects 141 can be coupled to inner terminals 1221. In some examples, after inner interconnects 141 are dropped on inner terminals 1221 of substrate 12, a reflow process can be performed or a laser beam can be irradiated and then cooled, thereby coupling inner interconnects 141 to inner terminals 1221 of substrate 12. In some examples, the component back sides of electronic components 15 and 16 can be spaced apart from inner side 123 of substrate 12. In some examples, the back sides of electronic components 15 and 16 can contact inner side 123 of substrate 12.

Outer terminals 1222 can be provided on the outer side of dielectric structure 121 (e.g., along substrate outer side 124). Outer terminals 1222 can be exposed from dielectric structure 121. Outer terminals 1222 can be coupled to embedded traces 1223 or embedded vias 1224. Outer terminals 1222 can comprise or be referred to as traces, bond fingers, lands, or pads. Outer terminals 1222 can comprise copper, aluminum, gold, silver, nickel, palladium, or an alloy. In some examples, the thicknesses of outer terminals 1222 can range from approximately 3 µm to approximately 50 µm. In some examples, outer interconnects 142 (FIG. 2E) can be coupled to outer terminals 1222.

Embedded traces 1223 can be provided extending in a substantially horizontal direction inside dielectric structure 121. Embedded traces 1223 provide electrical connection paths in an approximately horizontal direction in dielectric structure 121, and can be coupled to inner terminals 1221, outer terminals 1222, or embedded vias 1124. In some examples, the thicknesses of embedded traces 1223 can range from approximately 3 µm to approximately 50 µm. Embedded vias 1224 can be provided extending in a substantially vertical direction inside dielectric structure 121. Embedded vias 1224 provide electrical connection paths in an approximately vertical direction in dielectric structure 121, and can be coupled to inner terminals 1221, outer terminals 1222, or embedded traces 1223. In some examples, the width (or diameter) of embedded vias 1224 can range from approximately 3 µm to approximately 100 µm.

Figure 2D:
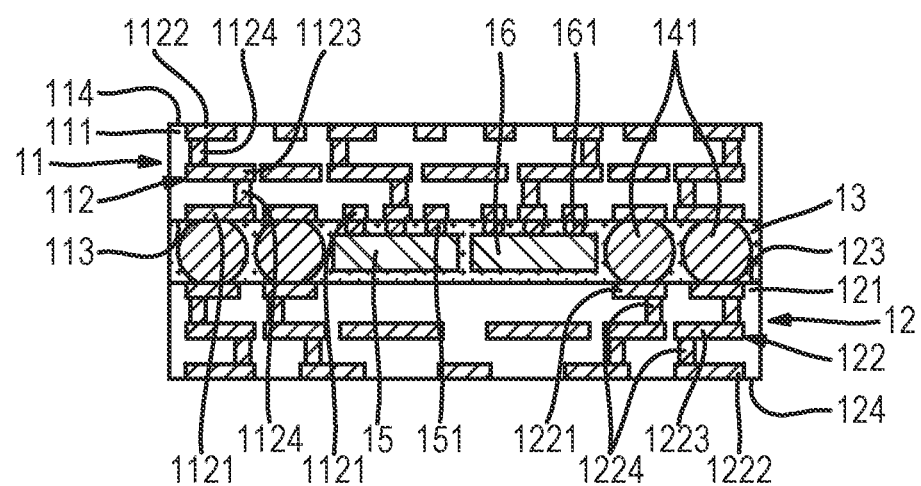

FIG. 2D shows a cross-sectional view of electronic device 10 at a later stage of manufacture. In the example shown in FIG. 2D, encapsulant 13 can be provided, encapsulant 13 can be provided between substrate 11 and substrate 12. Encapsulant 13 can contact electronic components 15 and 16, component interconnects 151 and 161, and inner interconnects 141. Encapsulant 13 can contact inner side 113 of substrate 11 and inner side 123 of substrate 12. In some examples, encapsulant 13 can comprise an epoxy resin, a filler, or a curing agent. In some examples, encapsulant 13 can comprise or be referred to as a mold compound, a resin, a sealant, a filler-reinforced polymer, or an organic body. In some examples, encapsulant 13 can be provided by a transfer molding process or a compression molding process. Transfer molding can be a process of hardening by supplying a fluid resin from a gate (supply port) of a mold to the periphery of a corresponding electronic component. Compression molding can be a process where a fluid resin is supplied into a mold in advance, and then an electronic component is put into the mold to harden the fluid resin. The thickness of encapsulant 13 can be similar to each inner interconnect 141. In some examples, the thickness of encapsulant 13 can range from approximately 50 µm to approximately 1000 µm. Encapsulant 13 can protect electronic components 15 and 16 from exposure to external elements or environments and can dissipate heat from electronic components 15 and 16.

Figure 2E:
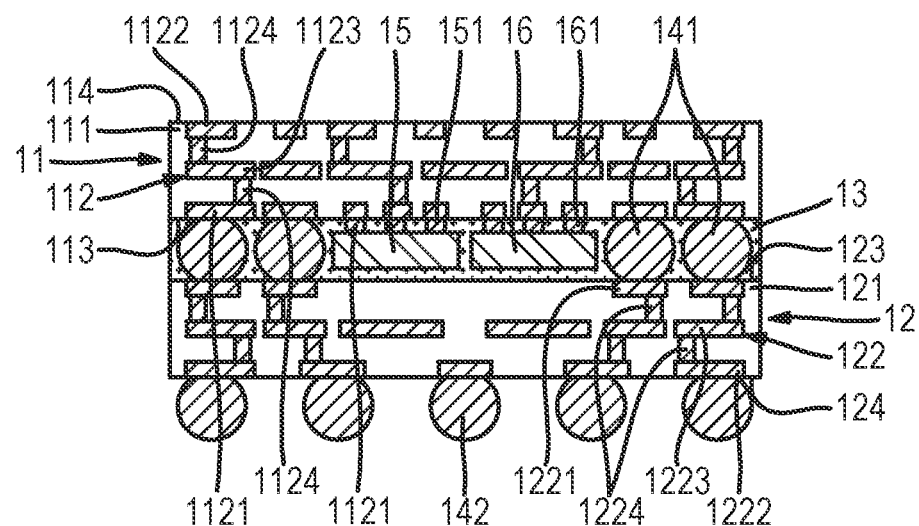

FIG. 2E shows a cross-sectional view of electronic device 10 at a later stage of manufacture. In the example shown in FIG. 2E, outer interconnects 142 can be provided. Outer interconnects 142 can be coupled to outer terminals 1222 of substrate 12. In some examples, after outer interconnects 142 are dropped on outer terminals 1222 of substrate 12, a reflow process can be performed or a laser beam can be irradiated and then cooled, thereby coupling outer interconnects 142 to outer terminals 1122. Outer interconnects 142 can comprise or be referred to as solder balls, solder-coated metal (Cu)-core balls, pillars, bumps, pins, or vertical wire bonds. Outer terminals 1222 can comprise copper, aluminum, gold, silver, nickel, palladium, or an alloy. In some examples, the thicknesses of outer interconnects 142 can range from approximately 50 µm to approximately 1000 µm. Outer interconnects 142 can couple substrate 12 to base substrate 18 (FIG. 2G).

In some examples, the process shown in FIGS. 2A to 2E can be performed with substrates 11 and 12 in a strip form. For example, a strip can include multiple individual substrate units laid out in, for example, rows and columns along the strip. Electronic components, inner interconnects, and outer interconnects can be coupled to the substrate units, and then the strip including substrate 11 units can be coupled to the strip including substrate 12. In some examples, the process shown in FIGS. 2A to 2E can be performed with individual (i.e., singulated) substrates 11 and 12. For example, a plurality of individual substrate 12 units may be placed (e.g., using pick and place equipment) over a carrier and then individual substrate 11 units, including electronic components 15 and 16 and inner interconnects 141 coupled thereto, may be placed on the individual substrate 12 units.

In accordance with various examples, Encapsulant 13 can be provided between the substrate units, in either strip of singulated form. In some examples, a sawing process can be performed after the encapsulating step or after the step of providing outer interconnects 142. In some examples, substrates 11 and 12 and encapsulant 13 can be sawed by means of a diamond wheel or a laser beam. In some examples, after singulation, the lateral sides of substrates 11 and 12 and the lateral side of encapsulant 13 can be coplanar.

Figure 2F:
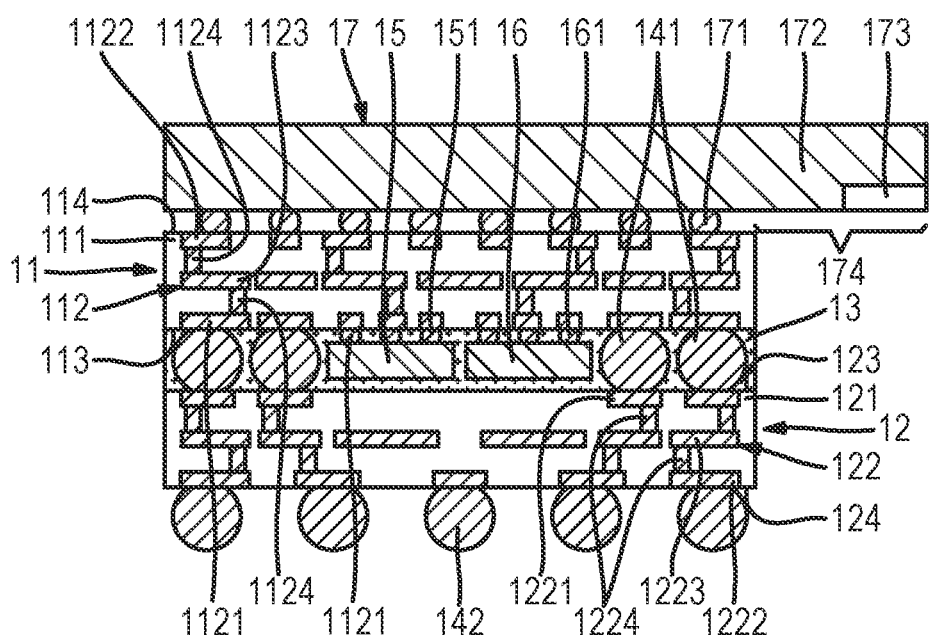
Figure 2G:
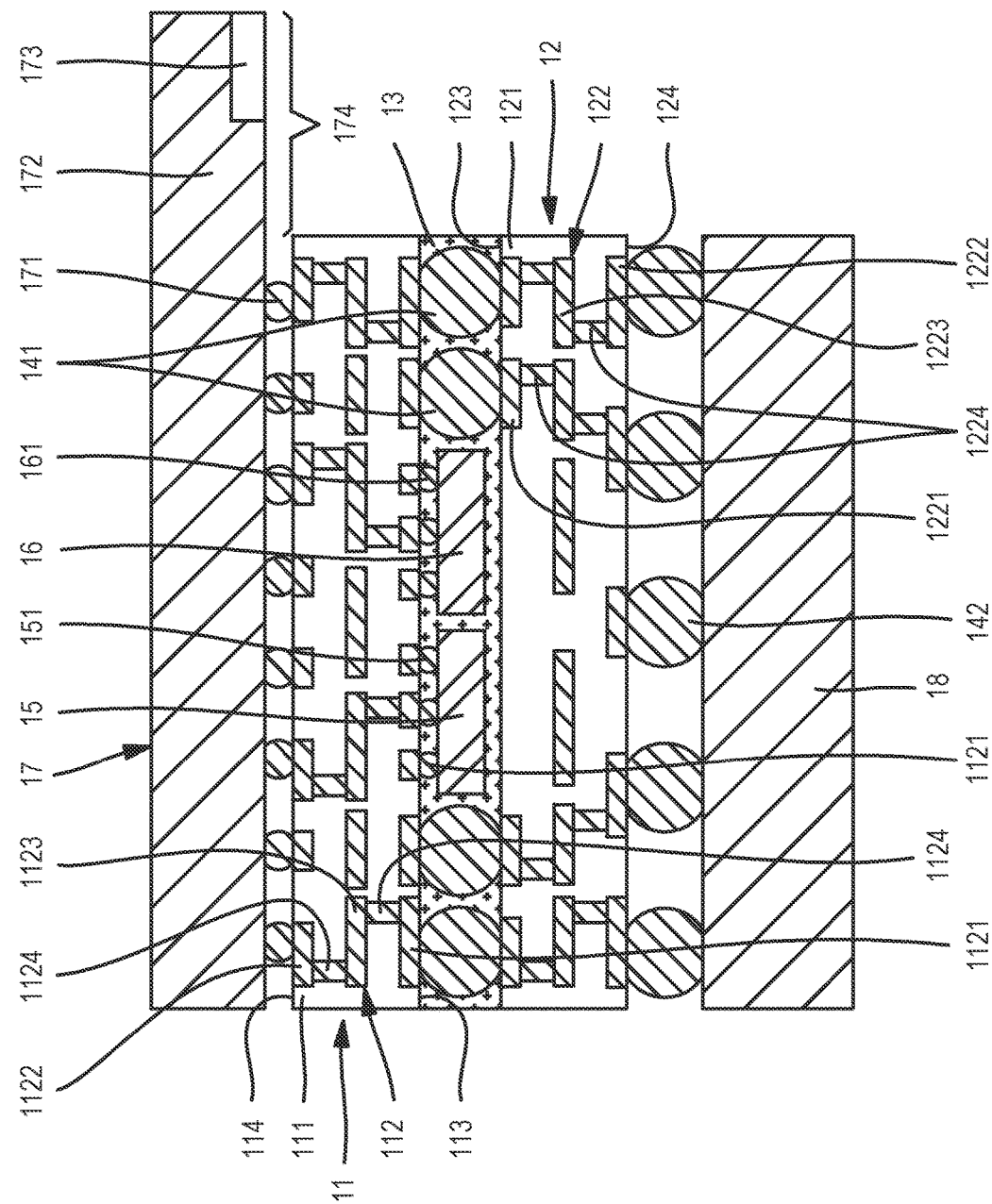

FIG. 2F shows a cross-sectional view of electronic device 10 at a later stage of manufacture. In the example shown in FIG. 2F, electronic component 17 can be provided over substrate 11. In some examples, electronic component 17 can comprise component interconnects 171, body 172, one or more groove(s) 173, and ledge portion 174. In some examples, electronic component 17 can be coupled to outer terminals 1122 of substrate 11 via component interconnects 171. Component interconnects 171 can comprise or be referred to as balls, bumps, pillars, posts, or pads. In some examples, after component interconnects 171 are aligned on outer terminals 1122 of substrate 11, a reflow process, a thermal ultrasonic compression process, or a laser assisted bonding process can be performed, thereby coupling component interconnects 171 to outer terminals 1122.

In some examples, the footprint of body 172 can be greater than the footprint of substrate 11, thereby to cause a portion of body 172 (i.e., ledge portion 174) to extend past the outer edge/lateral side of substrate 11. In some examples, a first lateral side of body 172 can be coplanar with a first lateral side of substrate 11, and a second lateral side of body 172, opposite the first later side, can be located outside a second lateral side of substrate 11. Stated differently, the distance between a pair of opposing lateral sides of body 172 can be greater than the distance between a pair of opposing lateral sides of substrate 11. In some examples, one or more groove(s) 173 (e.g., wave guides) can be provided in ledge portion 174. In some examples, ledge portion 174 can comprise an overhang structure or a cantilever structure, which extends beyond substrate 11. Optical interconnects 19 (FIG. 1) can be coupled to electronic component 17 at grooves 173.

Electronic component 17 can comprise or be referred to as a semiconductor die, a semiconductor chip, a semiconductor package, a semiconductor device, an active component, or a passive component. In some examples, electronic component 17 can comprise or be referred to as an optical component or a photonic integrated circuit (PIC). In some examples, the thickness of electronic component 17 can range from approximately 40 µm to approximately 1000 µm. In some examples, electronic component 17 can convert electrical signals from electronic components 15 and 16 into optical signals and provide the converted signals to an external device. Conversely, electronic component 17 can convert optical signals received from an external device into electrical signals, which are provided to electronic components 15 and 16. In some examples, electronic component 17 can be an optical component comprising a laser, a modulator, or a photodiode for driving an optical signal. In some examples, electronic component 15 can be an EIC, electronic component 16 can be a CDR, and electronic component 17 can be a PIC. Electronic component 17 is an example of an outer electronic component.

FIG. 2G shows a cross-sectional view of electronic device 10 at a later stage of manufacture. In the example shown in FIG. 2G, base substrate 18 (e.g., a PCB) can be provided. In some examples, electronic device 10 can be coupled to or can comprise base substrate 18. In some examples, outer interconnects 142 can be coupled to base substrate 18 through a reflow process. Substrate 18 can comprise or be referred to as a rigid printed circuit board, a flexible printed circuit board, a laminate substrate, a RDL substrate, a coreless substrate, a ceramic substrate, a glass substrate, a silicon substrate, or a package substrate. In some examples, optical interconnects 19 (FIG. 1), such as optical fibers, can be coupled to electronic device 10 by locating optical interconnects 19 in grooves 173. Electronic device 10 of FIG. 2G is an example of a structure where a first substrate (e.g., substrate 11), a second substrate (e.g., substrate 12), a first inner component (e.g., electronic component 15/16), and an outer electronic component (e.g., electronic component 17) are in a stacked configuration with the first inner electronic component interposed between the first substrate and the second substrate. In addition, electronic device 10 of FIG. 2G is an example of a first inner electronic component (e.g., electronic component 15) and a second inner electronic component (e.g., electronic component 16) in a side-by-side configuration.

In accordance with various examples, electronic device 10 can provide a co-packaged optics (CPO) integrating electronic components 15 and 16 with optical component 17. Optical component 17 and electronic components 15 and 16 can be coupled to each other by means of a high-density three-dimensional interposer (e.g., substrate 11), thereby providing high-speed interfaces (e.g., short electrical signal paths) between optical component 17 and electronic components 15 and 16. By applying an interposer-package-on package (IP POP) structure and a multi-chip array structure, an overall footprint or body size of electronic device 10 can be reduced.

Figure 3:
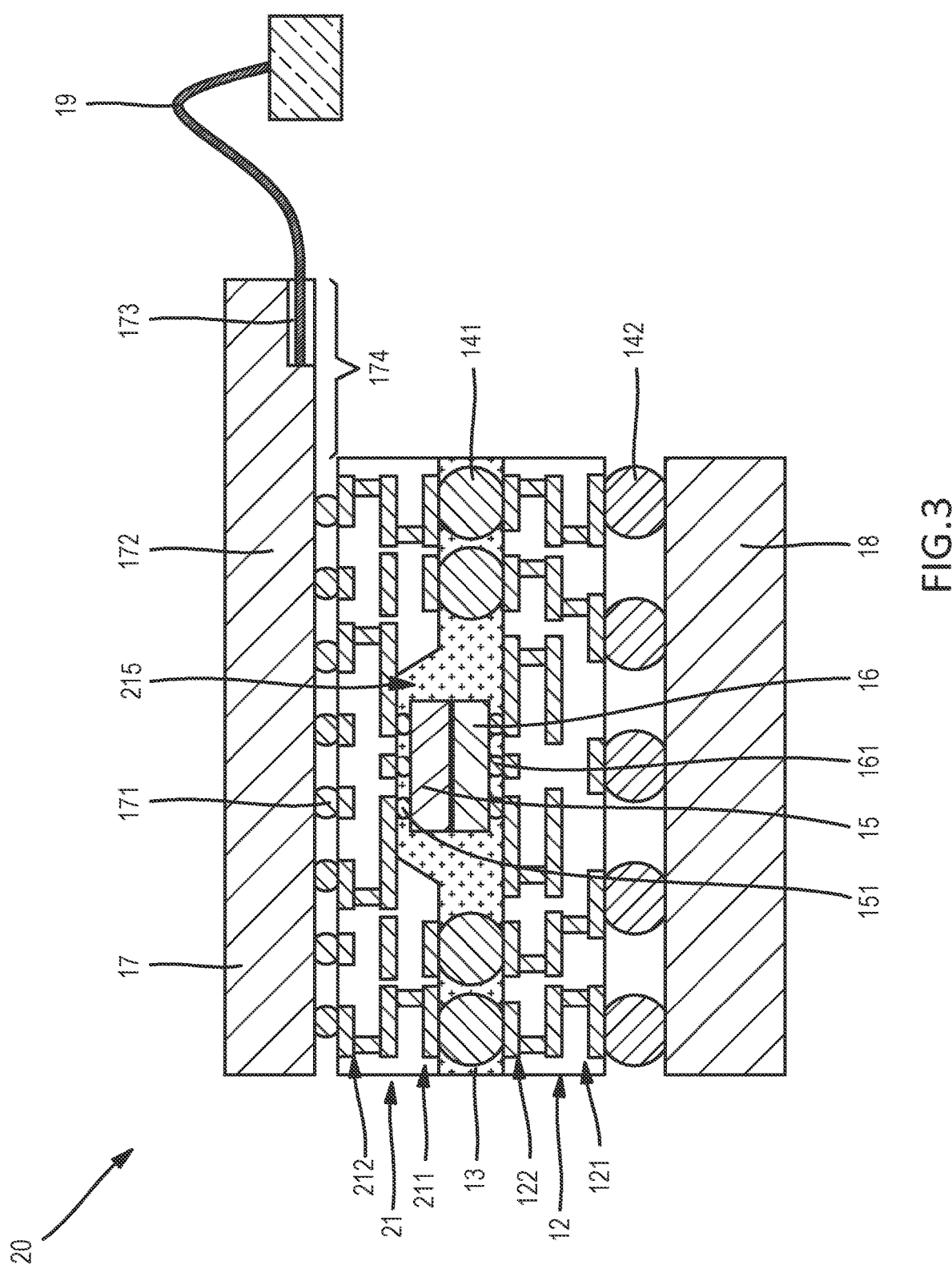
FIG. 3 shows a cross-sectional view of an example electronic device.

FIG. 3 shows a cross-sectional view of an example electronic device 20. In the example shown in FIG. 3, electronic device 20 can comprise substrate 21, substrate 12, encapsulant 13, inner interconnects 141, outer interconnects 142, electronic component 15, electronic component 16, and electronic component 17. In some examples, electronic device 20 can also comprise base substrate 18. In some examples, electronic device 20 can also comprise optical interconnects 19. Substrate 21 can comprise dielectric structure 211, conductive structure 212, and cavity 215. In some examples, electronic component 15 can be coupled to substrate 11, and electronic component 16 can be coupled to substrate 12.

FIGS. 4A to 4G show cross-sectional views of an example method for manufacturing electronic device 20. The structure and manufacturing method of electronic device 20 can be similar to those of electronic device 10 shown in FIGS. 1 and 2A to 2G, and thus the following description will focus on differences.

Figure 4A:
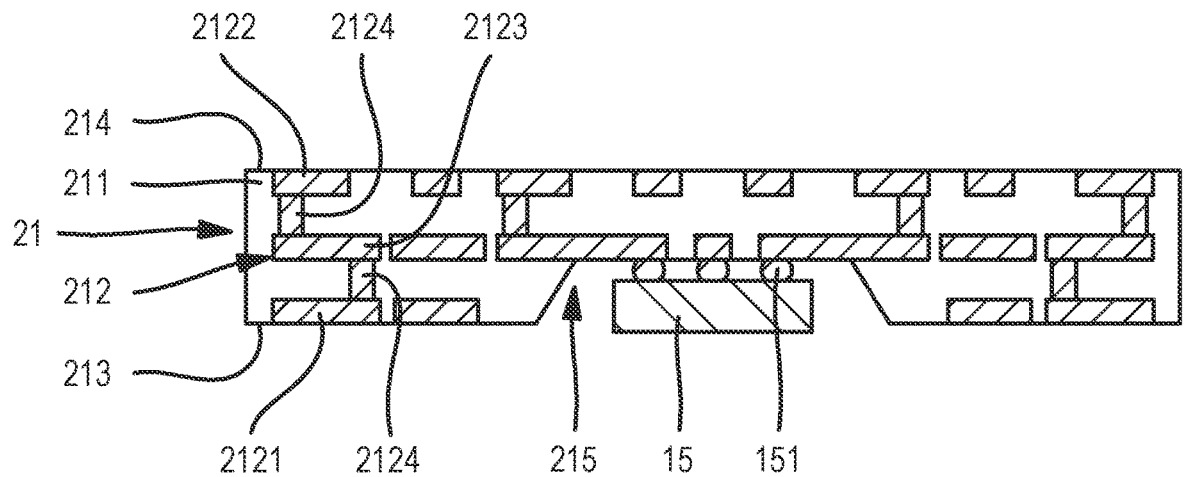
FIGS. 4A, 4B, 4C, 4D, 4E, 4F, and 4G show cross-sectional views of an example method for manufacturing an example electronic device.

FIG. 4A shows a cross-sectional view of electronic device 20 at an early stage of manufacture. In the example shown in FIG. 4A, substrate 21 and electronic component 15 can be provided. Substrate 21 can comprise dielectric structure 211, conductive structure 212, and cavity 215. Substrate 21 can also comprise substrate inner (or bottom) side 213 and substrate outer (or top) side 214 opposite substrate inner side 213. In some examples, cavity 215 extends partially inward from substrate inner side 213. Conductive structure 212 can comprise inner terminals 2121, outer terminals 2122, embedded traces 2123, and embedded vias 2124. In some examples, cavity 215 can be provided in inner side 213 of substrate 21. In some examples, cavity 215 can be provided by removing a portion of dielectric structure 211. In some examples, a portion of conductive structure 212 can be exposed through cavity 215. For example, at the floor of cavity 215, portions of conductive structure 212 may be exposed from dielectric structure 211 to allow for coupling of component interconnects 151 to conductive structure 212. The depth of cavity 215 can be similar to the thickness of electronic component 15. For example, the back side of electronic component 15 can be coplanar with inner side 213 of substrate 21 or the back side of electronic component 15 can be recessed with respect to inner side 213 of substrate 21. In some examples, cavity 215 can extend partially through substrate 21, such that a portion of substrate 21 remains between the floor of cavity 215 and outer side 214 of substrate 21. The footprint of cavity 215 can be greater than the footprint of electronic component 15. Electronic component 15 can be coupled to conductive structure 212 exposed through cavity 215. In some examples, component interconnects 151 of electronic component 15 can be coupled to conductive structure 212 (e.g., exposed embedded traces 2123) within cavity 215.

Figure 4B:
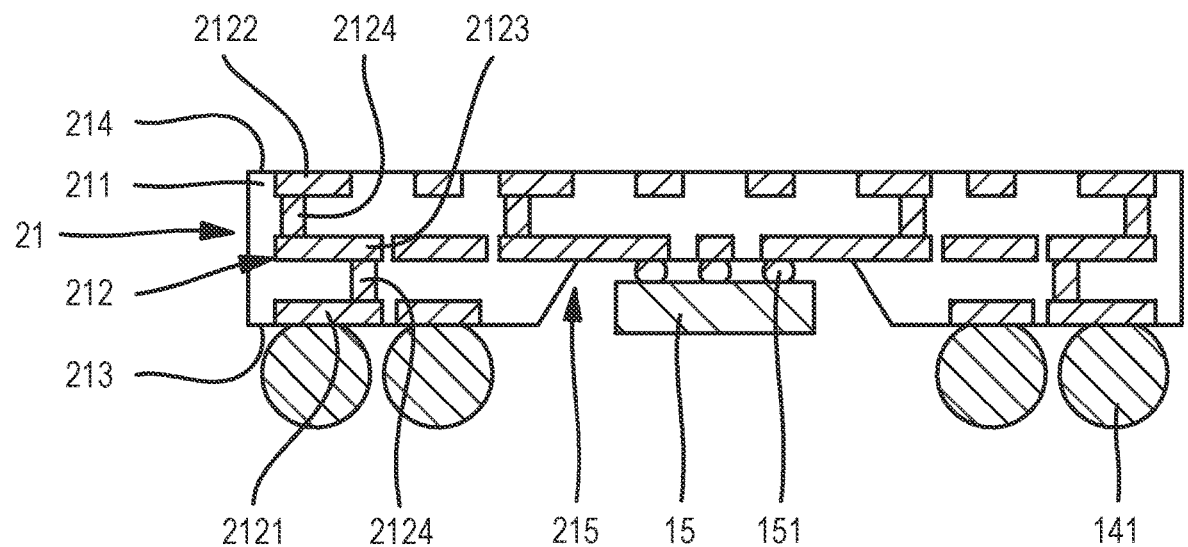

FIG. 4B shows a cross-sectional view of electronic device 20 at a later stage of manufacture. In the example shown in FIG. 4B, inner interconnects 141 can be provided. Inner connects 141 can be coupled to inner terminals 2121 of substrate 21. In some examples, inner interconnects 141 can be coupled to inner terminals 2121 that are arranged outside cavity 215.

Figure 4C:
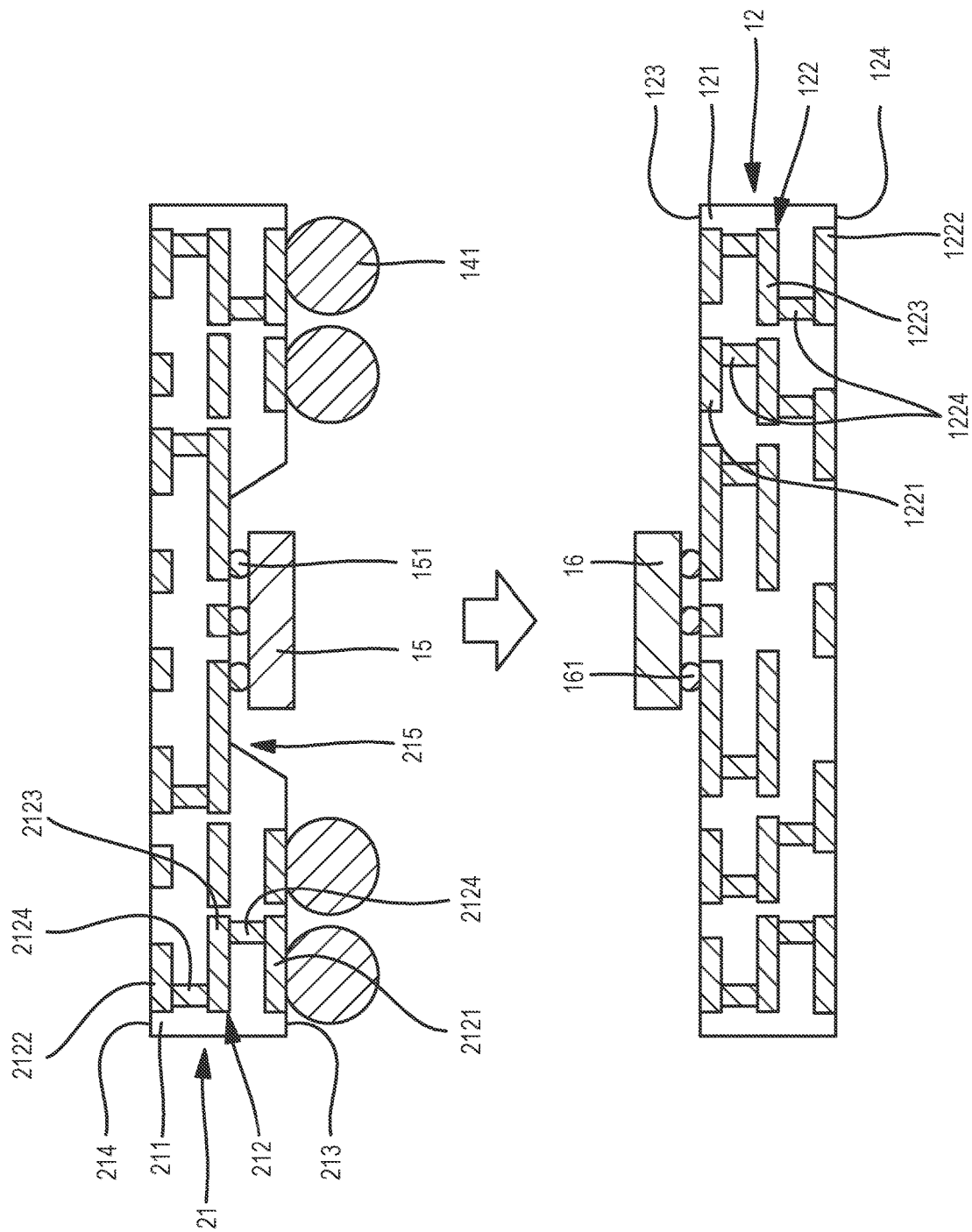

FIG. 4C shows a cross-sectional view of electronic device 20 at a later stage of manufacture. In the example shown in FIG. 4C, substrate 12 and electronic component 16 can be provided. Electronic component 16 can be coupled to substrate 12. In some examples, component interconnects 161 of electronic component 16 can be coupled to inner terminals 1221 of substrate 12. Electronic component 16 can vertically overlap, at least, a portion of electronic component 15. For example, electronic component 16 can be vertically aligned with (or at least partially vertically overlapping) electronic component 15. Electronic component 15 can be positioned above electronic component 16, and electronic component 16 can be positioned below electronic component 15. In some examples, inner interconnects 141 can also be coupled to inner terminals 1221 of substrate 12. In some examples, the back side of electronic component 15 can be in contact with the back side of electronic component 16. In some examples, the back side of electronic component 15 can be spaced apart from the back side of electronic component 16.

Figure 4D:
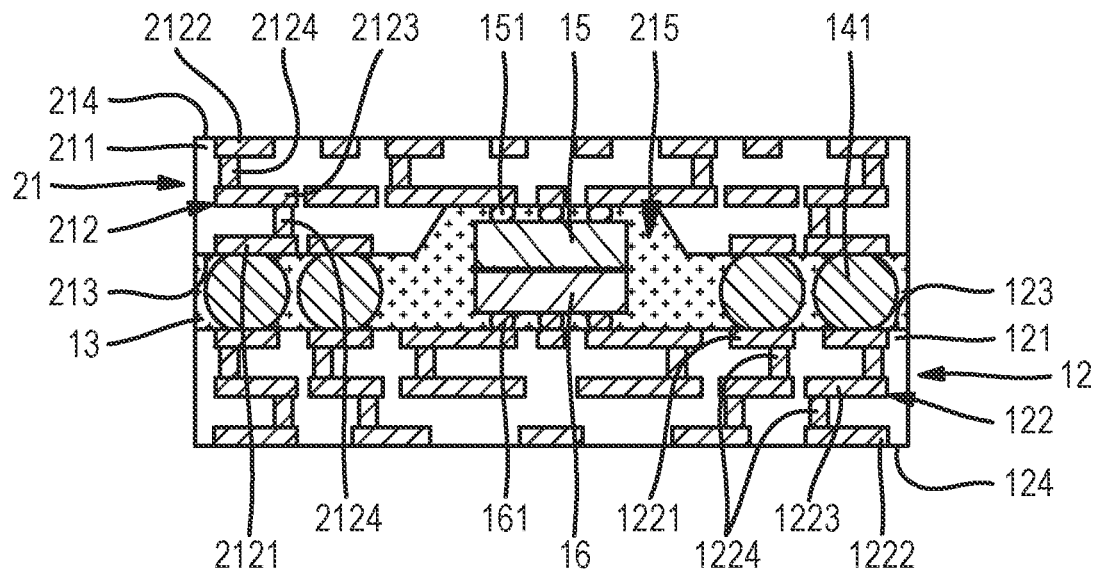

FIG. 4D shows a cross-sectional view of electronic device 20 at a later stage of manufacture. In the example shown in FIG. 4D, encapsulant 13 can be provided. Encapsulant 13 can be provided between substrate 21 and substrate 12. Encapsulant 13 can fill cavity 215 of substrate 21. Encapsulant 13 can contact the floor and sidewalls defining cavity 215, electronic components 15 and 16, component interconnects 151 and 161, and inner interconnects 141. Encapsulant 13 can also contact inner side 213 of substrate 21 and inner side 123 of substrate 12.

Figure 4E:
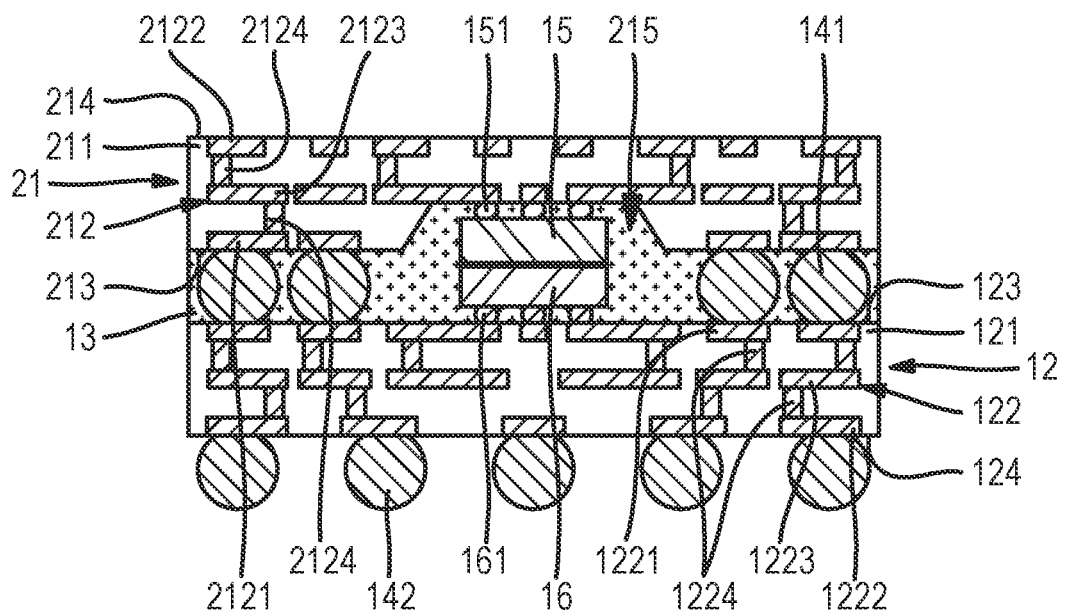

FIG. 4E shows a cross-sectional view of electronic device 20 at a later stage of manufacture. In the example shown in FIG. 4E, outer interconnects 142 can be provided. Outer interconnects 142 can be coupled to outer terminals 1222 of substrate 12.

Figure 4F:
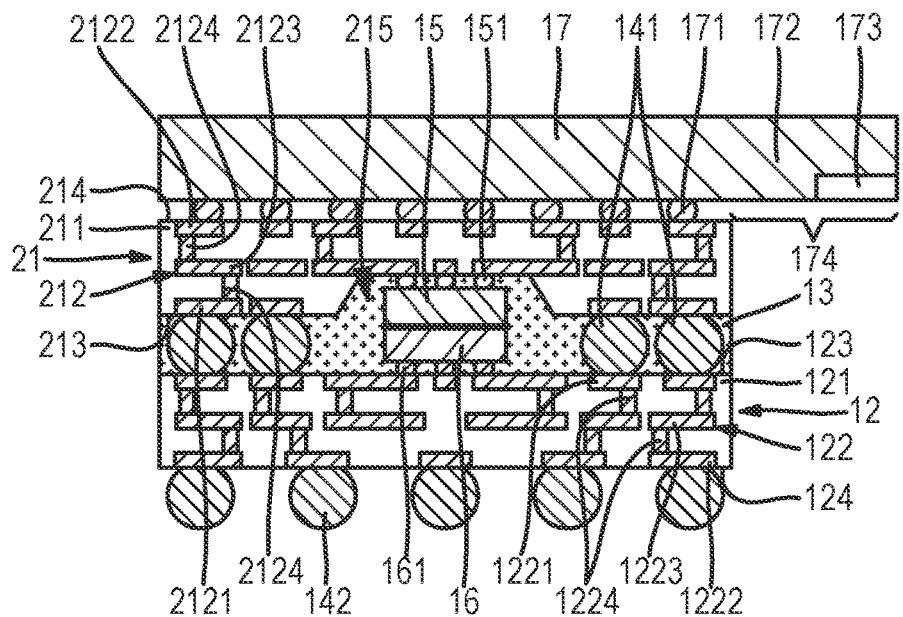

FIG. 4F shows a cross-sectional view of electronic device 20 at a later stage of manufacture. In the example shown in FIG. 4F, electronic component 17 can be provided. In some examples, electronic component 17 can be located over outer side 214 of substrate 21. Electronic component 17 can be coupled to outer terminals 2122 of substrate 21 via component interconnects 171. Electronic component 17 can comprise or be referred to as an optical component or a PIC.

Figure 4G:
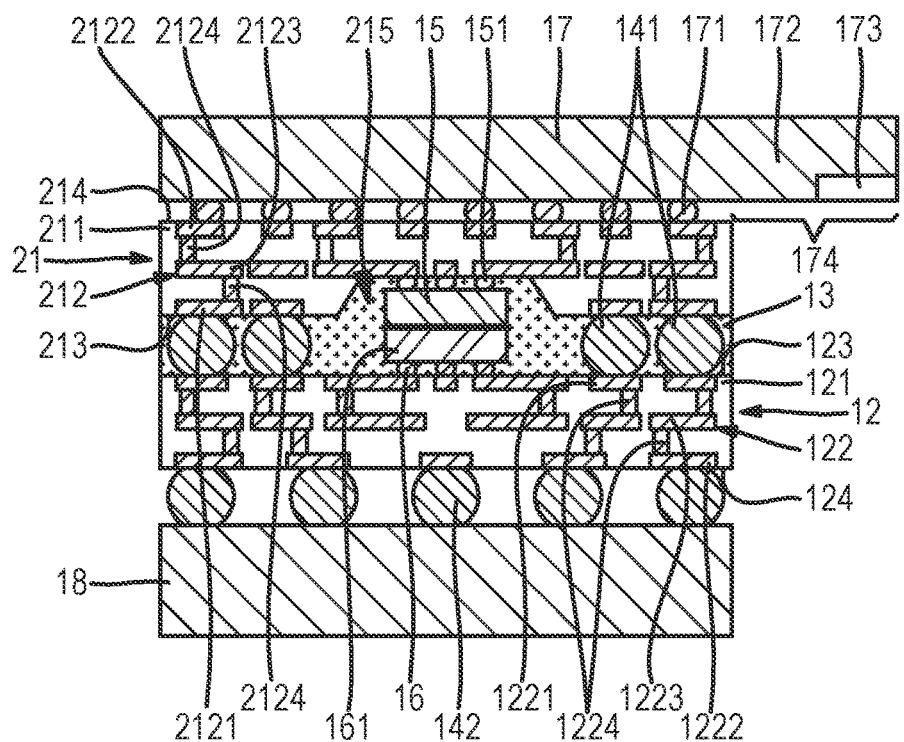

FIG. 4G shows a cross-sectional view of electronic device 20 at a later stage of manufacture. In the example shown in FIG. 4G, base substrate 18 can be provided. In some examples, electronic device 20 can be coupled to or can comprise base substrate 18. Electronic device 20 of FIG. 4G is an example of a structure where a first substrate (e.g., substrate 21), a second substrate (e.g., substrate 12), a first inner component (e.g., electronic component 15), and an outer electronic component (e.g., electronic component 17) are in a stacked configuration with the first inner electronic component interposed between the first substrate and the second substrate. Also, electronic device 20 of FIG. 4G is an example of an electronic device where the first inner electronic component (e.g., electronic component 15) is positioned above and vertically overlaps a second inner electronic component (e.g., electronic component 16), which is coupled to a second substrate (e.g., substrate 12). In addition, electronic device of FIG. 4G is an example of a first inner electronic component (e.g., electronic component 15) located within a cavity (e.g., cavity 215).

In accordance with various examples, substrate 21 including cavity 215, in which electronic component 15 can be located, reduces the footprint (or width) of substrate 21, which tends to reduce an overall footprint of electronic device 20. Electronic component 15 can be coupled to substrate 21, and electronic component 16 can be coupled to substrate 12, which tends to reduce the circuit densities of substrates 21 and 15, thereby lowering the manufacturing costs and complexities. Coupling electronic component 15 to the conductive patterns exposed in cavity 215 of substrate 21, can reduce the electrical signal path distance between electronic component 15 and electronic component 17.

Figure 5:
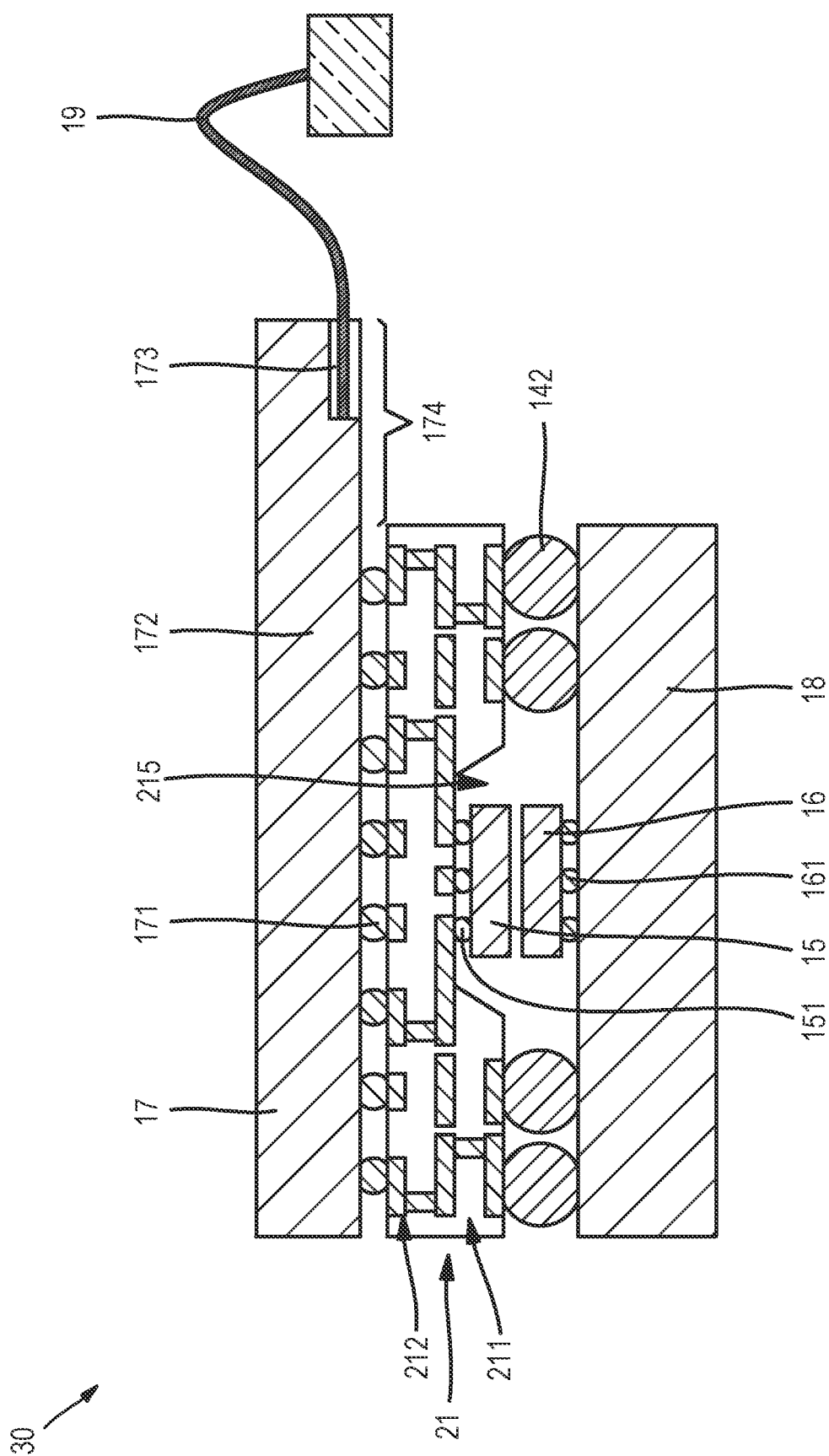
FIG. 5 shows a cross-sectional view of an example electronic device.

FIG. 5 shows a cross-sectional view of an example electronic device 30. In the example shown in FIG. 5, electronic device 30 can comprise substrate 21, outer interconnects 142, electronic component 15, electronic component 16, electronic component 17, base substrate 18 (optional), and optical interconnects 19 (optional). Substrate 21 can comprise dielectric structure 211, conductive structure 212, and cavity 215. Cavity 215 can be configured to accommodate vertically positioned electronic components 15 and 16. In some examples, electronic component 15 can be coupled to a portion of conductive structure 212 exposed at the floor of cavity 215, and electronic component 16 can be coupled to base substrate 18.

FIGS. 6A to 6F show cross-sectional views of an example method for manufacturing electronic device 30. The structure and manufacturing method of electronic device 30 can be similar to those of electronic device 10 shown in FIGS. 2A to 2G or those of electronic device 20 shown in FIGS. 4A to 4G, and thus the following description will focus on differences.

Figure 6A:
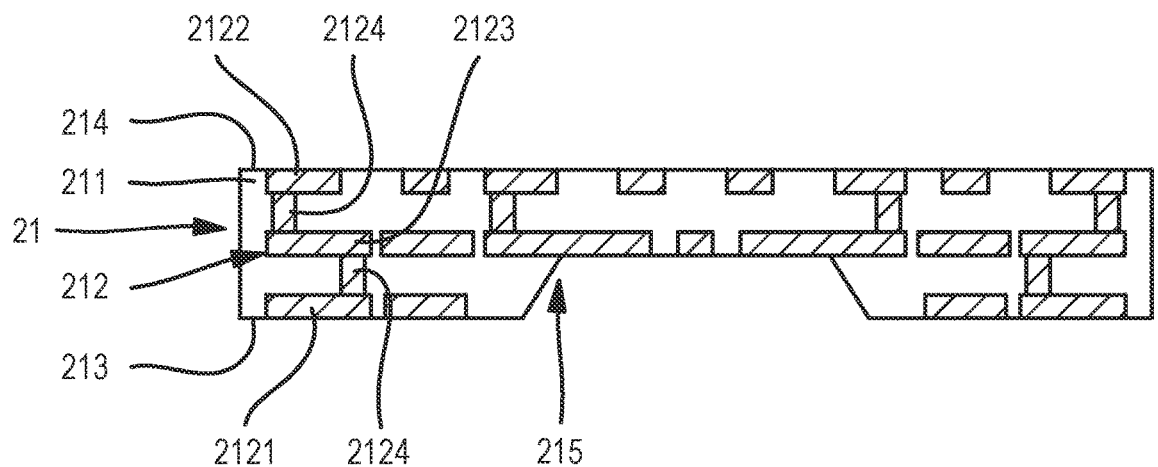
FIGS. 6A, 6B, 6C, 6D, 6E, and 6F show cross-sectional views of an example method for manufacturing an example electronic device.

FIG. 6A shows a cross-sectional view of electronic device 30 at an early stage of manufacture. In the example shown in FIG. 6A, substrate 21 can be provided. Substrate 21 can comprise or be referred to as a rigid printed circuit board, a flexible printed circuit board, a laminate substrate, a RDL substrate, a coreless substrate, a ceramic substrate, a glass substrate, a silicon substrate, or a package substrate. Substrate 21 can comprise dielectric structure 211, conductive structure 212, and cavity 215. In some examples, cavity 215 can be provided in inner side 213 of substrate 21. A portion of conductive structure 212 (e.g., embedded traces 2123) can be exposed at floor of cavity 215. The depth of cavity 215 can be similar to the thickness of electronic component 15. The width of cavity 215 can be greater than the width of electronic component 15.

Figure 6B:
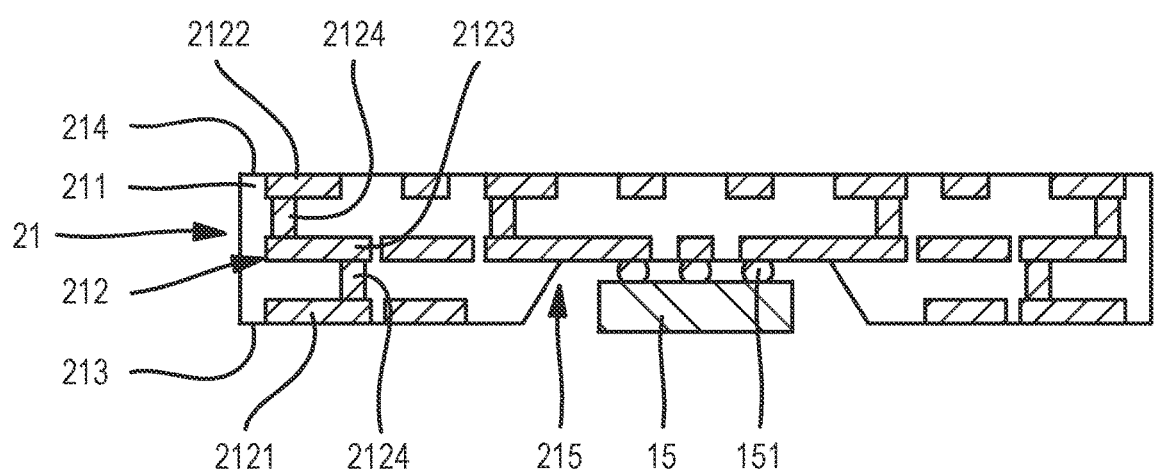

FIG. 6B shows a cross-sectional view of electronic device 30 at a later stage of manufacture. In the example shown in FIG. 6B, electronic component 15 can be provided. In some examples, electronic component 15 can be coupled to conductive structure 212 exposed at the floor of cavity 215. In some examples, component interconnects 151 of electronic component 15 can be coupled to conductive structure 211

(e.g., embedded traces 2123) exposed from dielectric structure 211 along the floor of cavity 215.

Figure 6C:
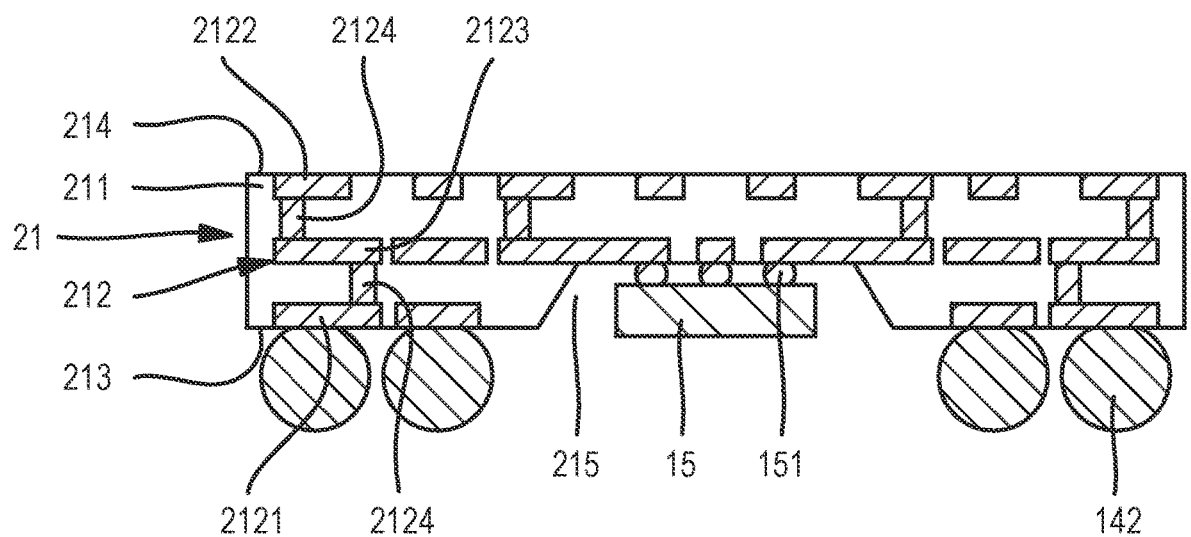

FIG. 6C shows a cross-sectional view of electronic device 30 at a later stage of manufacture. In the example shown in FIG. 6C, outer interconnects 142 can be provided. Outer interconnects 142 can be coupled to lower terminals 2121 that are arranged outside cavity 215.

Figure 6D:
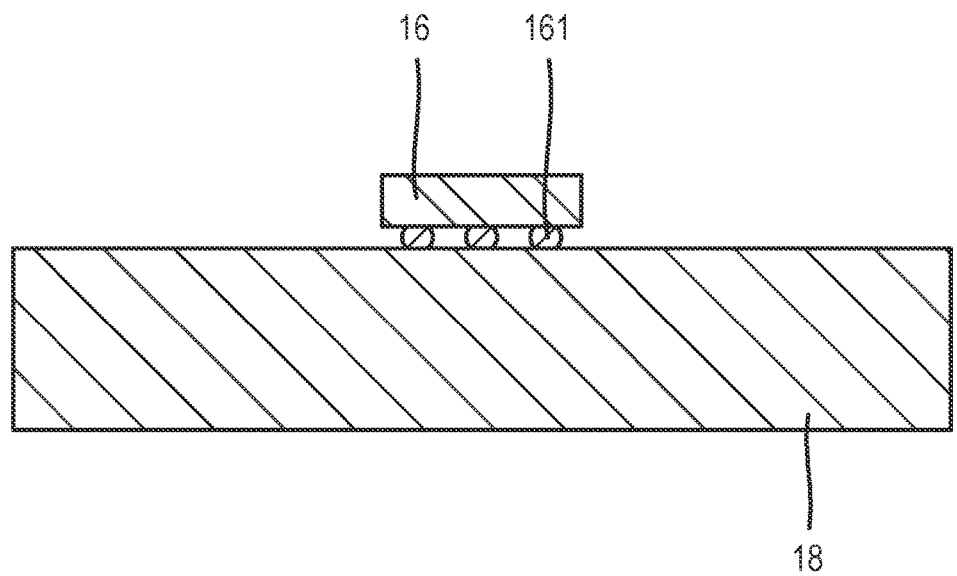

FIG. 6D shows a cross-sectional view of electronic device 30 at a later stage of manufacture. In the example shown in FIG. 6D, electronic component 16 can be provided. Electronic component 16 can be coupled to base substrate 18. In some examples, component interconnects 161 of electronic component 16 can be coupled to the circuit pattern of base substrate 18. Substrate 18 can comprise or be referred to as a rigid printed circuit board, a flexible printed circuit board, a laminate substrate, a RDL substrate, a coreless substrate, a ceramic substrate, a glass substrate, a silicon substrate, or a package substrate.

Figure 6E:
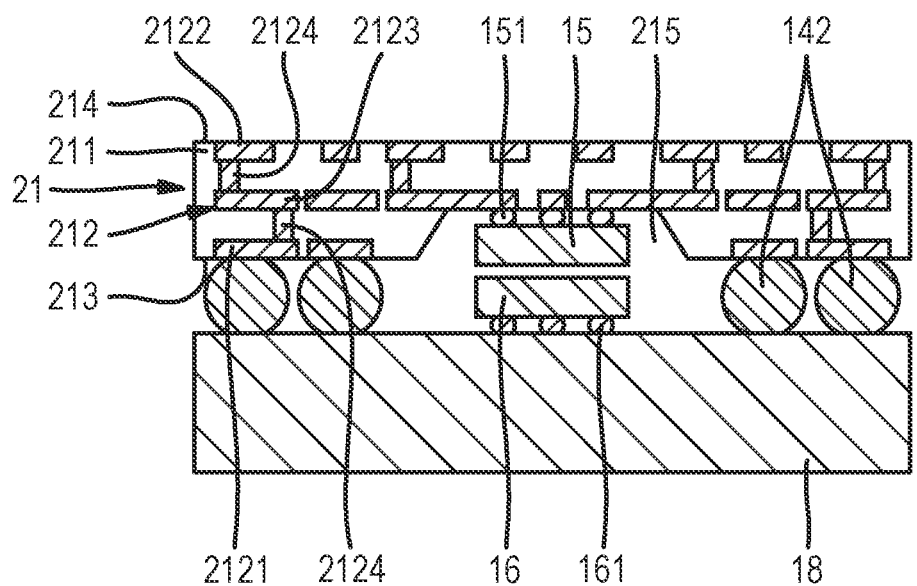

FIG. 6E shows a cross-sectional view of electronic device 30 at a later stage of manufacture. In the example shown in FIG. 6E, substrate 21 can be coupled to base substrate 18. In some examples, outer interconnects 142 can be coupled to the circuit pattern of base substrate 18. Electronic component 15 can be positioned above electronic component 16, and electronic component 16 can be positioned below electronic component 15. In some examples, electronic component 15 can vertically overlap, at least, a portion of electronic component 16. For example, electronic component 16 can be vertically aligned with (or at least partially vertically overlapping) electronic component 15. In some examples, the back side of electronic component 15 can be spaced apart from the back side of electronic component 16. In some examples, the back side of electronic component 15 can be in contact with the back side of electronic component 16.

Figure 6F:
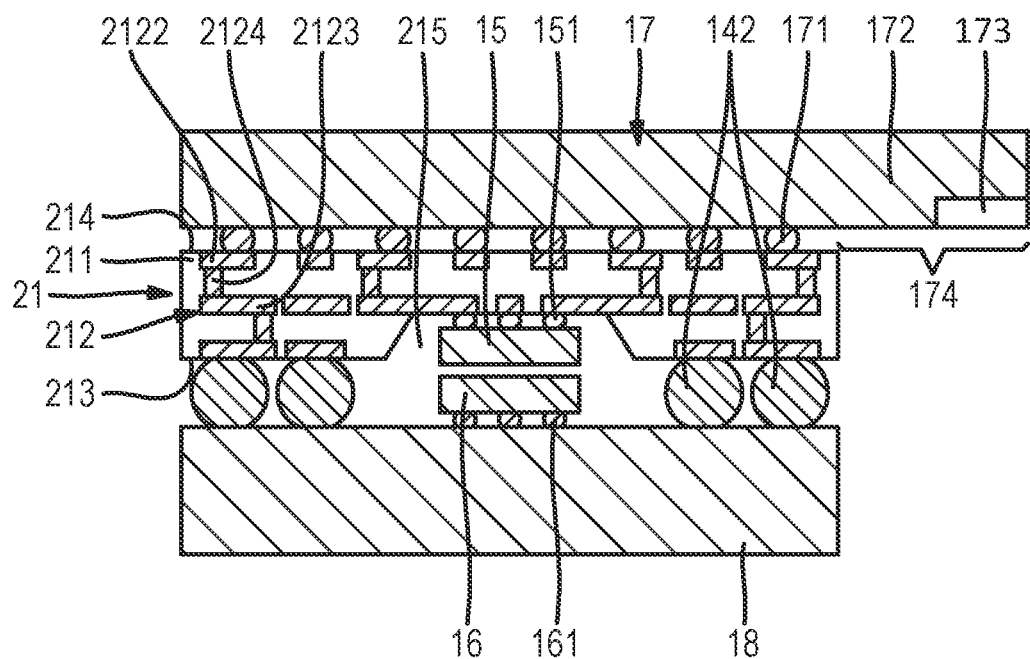

FIG. 6F shows a cross-sectional view of electronic device 30 at a later stage of manufacture. In the example shown in FIG. 6F, electronic component 17 can be provided. In some examples, electronic component 17 can be coupled to upper terminals 2122 of substrate 21 via component interconnects 171. In some examples, electronic component 17 can comprise or be referred to as an optical component or a PIC. Electronic device 30 of FIG. 6F is an example of a structure where a first substrate (e.g., substrate 21), a second substrate (e.g., substrate 18), a first inner component (e.g., electronic component 15), and an outer electronic component (e.g., electronic component 17) are in a stacked configuration with the first inner electronic component interposed between the first substrate and the second substrate. Also, electronic device 30 of FIG. 6F is an example of an electronic device where the first inner electronic component (e.g., electronic component 15) is positioned above and vertically overlaps a second inner electronic component (e.g., electronic component 16), which is coupled to a second substrate (e.g., substrate 18). In addition, electronic device of FIG. 6F is an example of a first inner electronic component (e.g., electronic component 15) located within a cavity (e.g., cavity 215).

In accordance with various examples, substrate 21 including cavity 215, in which electronic component 15 can be located, reduces the footprint (or width) of substrate 21, which tends to reduce an overall footprint of electronic device 30. Coupling electronic component 15 to substrate 21, and electronic component 16 to base substrate 18, tends to decrease the circuit density of substrate 21, thereby lowering the manufacturing costs and complexities. In some examples, using cavity substrate 21 without an interposer (e.g., eliminating substrate 12 from electronic device 30), allows for the height or thickness of electronic device 30 to be reduced and the electrical signal path distance between the electronic components 15 and 16 and electrical component 17 to be decreased.

Figure 7:
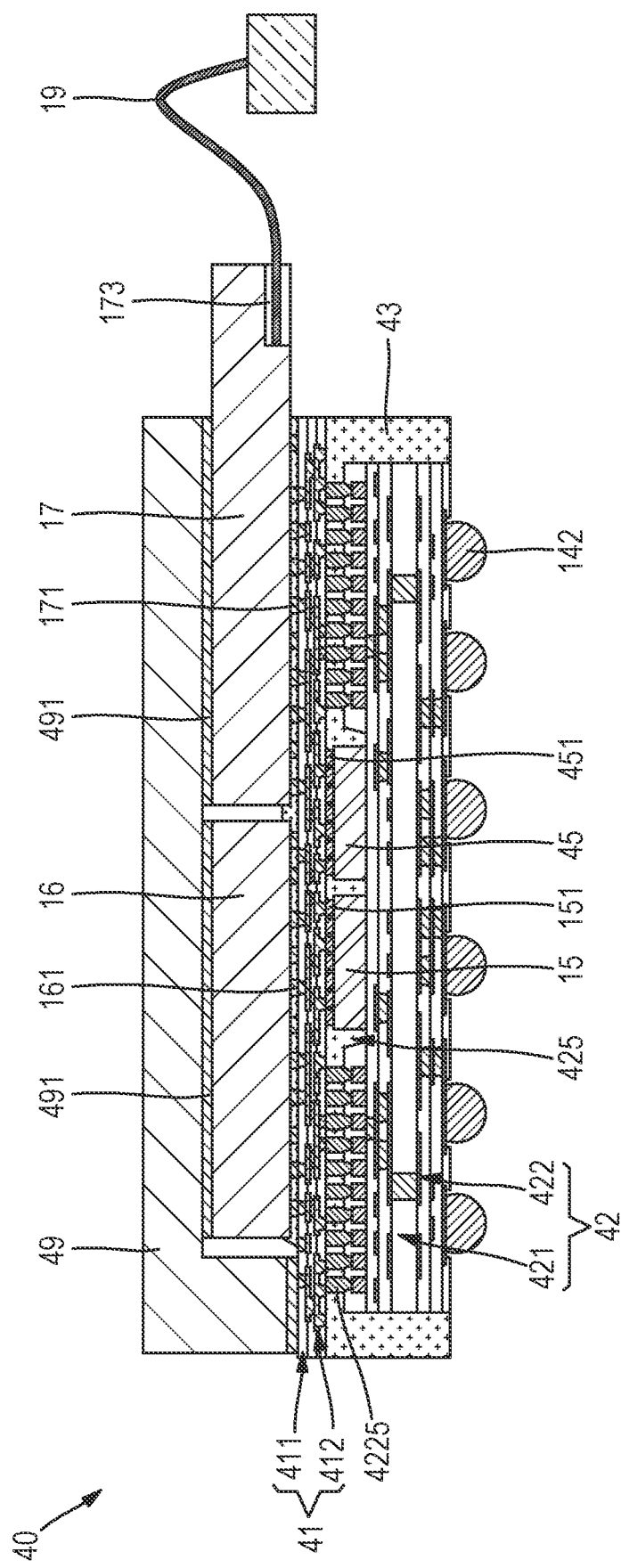
FIG. 7 shows a cross-sectional view of an example electronic device.

FIG. 7 shows a cross-sectional view of an example electronic device 40. In the example shown in FIG. 7, electronic device 40 can comprise substrate 41, substrate 42, encapsulant 43, electronic component 15, electronic component 16, electronic component 17, electronic component 45, and cover 49.

Substrate 41 can comprise dielectric structure 411 and conductive structure 412. Substrate 42 can comprise dielectric structure 421, conductive structure 422, and cavity 425. Conductive structure 422 can comprise substrate interconnects 4225. Substrate 42 can couple electronic components 15, 16, 17, and 45 to one another or to an external device, and can protect electronic components 15, 16, 17, and 45 from external environments. Electronic component 45 can comprise component interconnects 451. Cover 49 can comprise interface material 491.

Substrates 41 and 42, encapsulant 43, and cover 49 can be referred to as an electronic package or a package and can provide protection for electronic components 15, 16, 17, and 45 from external elements or environmental exposure. In some examples, substrates 41 and 42, encapsulant 43, cover 49, and electronic components 15, 16, 17, and 45 can be referred to as a COP and can provide coupling to external electrical components through optical interconnects 19.

FIGS. 8A to 8G show cross-sectional views of an example method for manufacturing electronic device 40.

FIG. 8A shows a cross-sectional view of electronic device 40 at an early stage of manufacture. In the example shown in FIG. 8A, substrate 42 can be provided. In some examples, substrate 42 can be provided on a carrier 48. Substrate 42 can comprise or be referred to as an Ajinomoto build-up film (ABF) circuit board, a rigid printed circuit board, a flexible printed circuit board, a laminate substrate, a RDL substrate, a coreless substrate, a ceramic substrate, a glass substrate, a silicon substrate, or a package substrate. Substrate 42 can be similar to substrates 11 and 12 described above, and thus the following description will focus on differences.

Substrate 42 can comprise dielectric structure 421 and conductive structure 422. Substrate 42 can also comprise substrate inner side 423 and substrate outer side 424 opposite substrate inner side 423. In some examples, cavity 425 can be provided in substrate inner side 423. In some examples, substrate 42 may not include cavity 425. For example, inner side 423 of substrate 42 can be substantially planar.

Dielectric structure 421 can comprise or be referred to as one or more dielectric layers. Conductive structure 422 can comprise or be referred to as one or more conductive layers, traces, pads, patterns, or under bumped metallization (UBMs). Conductive structure 422 can comprise inner terminals 4221, outer terminals 4222, embedded traces 4223, embedded vias 4224, and substrate interconnects 4225. Substrate interconnects 4225 can be provided on inner terminals 4221. Substrate interconnects 4225 can be exposed or protruded from dielectric structure 421 (e.g., from inner side 423 of substrate 42). Substrate interconnects 4225 can be located outside cavity 425. Substrate interconnects 4225 can be coupled to embedded traces 1123 or embedded vias 1124 via inner terminals 1121. Substrate interconnects 4225 can comprise or be referred to as pillars, posts, or vertical wires. Substrate interconnects 4225 can comprise copper, aluminum, gold, silver, nickel, palladium, or an alloy. In some examples, the thicknesses of substrate interconnects 4225 can range from approximately 3 µm to approximately 50 µm.

FIG. 8B shows a cross-sectional view of electronic device 40 at a later stage of manufacture. In the example shown in FIG. 8B, electronic components 15 and 45 can be provided on substrate 42. In some examples, electronic components 15 and 45 can be located in cavity 425. Each of electronic components 15 and 45 can comprise an active side and a back side opposite the active side. The back side of electronic components 15 and 45 can face the floor of cavity 425 or inner side 423 in examples where substrate 42 does not include cavity 425. Electronic components 15 and 45 can comprise component interconnects 151 and 451, respectively. Component interconnects 151 and 451 can comprise or be referred to as bumps, SnPb bumps, lead free bumps, copper posts, copper pillars, stud bumps, or pads. Electronic components 15 and 45 can be coupled to the floor of cavity 425 (or inner side 423 of substrate 42) via an adhesive. Electronic components 15 and 45 can comprise or be referred to as semiconductor dies, semiconductor chips, semiconductor packages, semiconductor devices, active components, or passive components. Each of electronic components 15 and 45 can also comprise or be referred to as an EIC, a CDR, a PMIC, a DSP, a network processor, an audio processor, a wireless baseband system-on-chip processor, a sensor, an application specific integrated circuit, a memory, or an IPD. In some examples, electronic component 15 can be an EIC and electronic component 45 can be a PMIC.

Figure 8C:
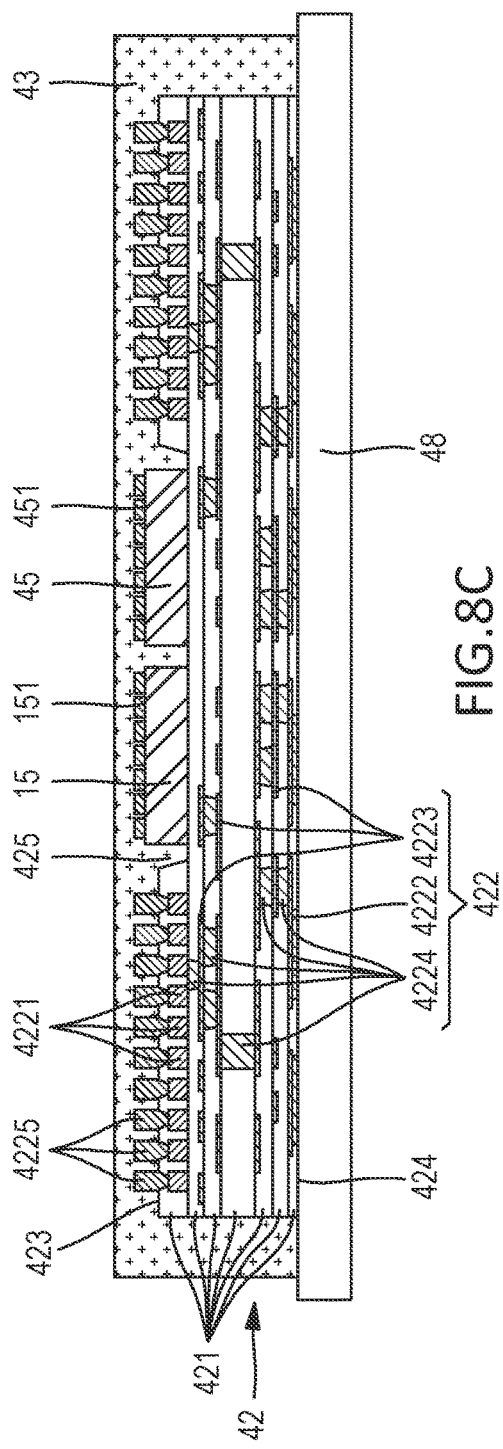

FIG. 8C shows a cross-sectional view of electronic device 40 at a later stage of manufacture. In the example shown in FIG. 8C, encapsulant 43 can be provided. Encapsulant 43 can be formed over and can contact substrate 42 and electronic components 15 and 45. In some examples, encapsulant 43 can contact and surround the lateral sides of electronic components 15 and 45, substrate interconnects 4225, and component interconnects 151 and 451. In some examples, encapsulant 43 can contact the lateral side of substrate 42. In some examples, encapsulant 43 can cover substrate 42, substrate interconnects 4225, electronic components 15 and 45, component interconnects 151 and 451, inner side 423 of substrate 42, and the lateral sides of substrate 42. Encapsulant 43 can protect electronic components 15 and 45 and substrate interconnects 4225 from external elements or environmental exposure.

Figure 8D:
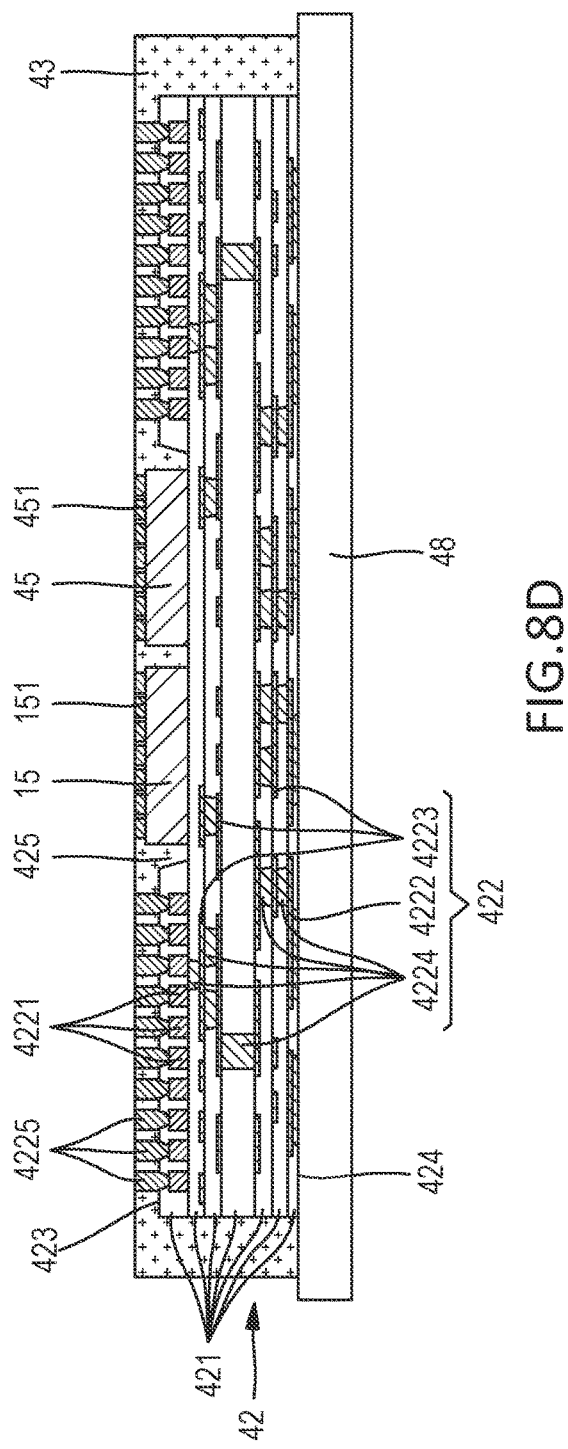

FIG. 8D shows a cross-sectional view of electronic device 40 at a later stage of manufacture. In the example shown in FIG. 8D, a portion of encapsulant 43 can removed (e.g., by grinding) to expose component interconnects 151 and 451 and substrate interconnects 4225. In some examples, a grinding process can be performed until component interconnects 151 and 451 and substrate interconnects 4225 are exposed from encapsulant 43. In some examples, removing the portion of encapsulant 43 (e.g., after the grinding process), the surfaces of encapsulant 43, component interconnects 151 and 451, and substrate interconnects 4225 can be coplanar. FIG. 8D illustrates an example, where the first component interconnects (e.g., component interconnects 151), the second component interconnects (e.g., component interconnects 451), and the inner interconnects (e.g., substrate interconnects 4225) are exposed from the top side of the encapsulant (e.g., encapsulant 40).

FIG. 8E shows a cross-sectional view of electronic device 40 at a later stage of manufacture. In the example shown in FIG. 8E, substrate 41 can be provided. In some examples, substrate 41 can comprise or be referred to as a RDL substrate, a rigid printed circuit board, a flexible printed circuit board, a laminate substrate, a coreless substrate, a ceramic substrate, a glass substrate, a silicon substrate, or a package substrate. In some examples, the thickness of substrate 41 can range from approximately 20 µm to approximately 2000 µm. Substrate 41 can be coupled to the substrate interconnect 4225 and component interconnects 151 and 451. Substrate 41 can couple electronic components 15, 45, 16, and 17 to one another or be coupled to substrate 42. Substrate 41 can comprise dielectric structure 411 and conductive structure 412. Substrate 41 can also comprise substantially planar substrate inner side 413 and substantially planar substrate outer side 414 opposite substrate inner side 413. Electronic components 15 and 45 and substrate interconnects 4225 can be coupled to substrate inner side 413.

Dielectric structure 411 can comprise or be referred to as one or more dielectric layers. In some examples, the thickness of dielectric structure 411 can range from approximately 3 µm to approximately 100 µm. Conductive structure 412 can comprise or be referred to as one or more conductive layers, traces, pads, patterns, and under bumped metals (UBMs). In some examples, the thickness of conductive structure 412 can range from approximately 3 µm to approximately 50 µm.

Conductive structure 412 can comprise inner terminals 4121, outer terminals 4122, embedded traces 4123, and embedded vias 4124. Inner terminals 4121 can be provided on the inner side of dielectric structure 411 (e.g., on inner side 413 of substrate 41). Inner terminals 4121 can be exposed from the inner side of dielectric structure 411. Inner terminals 4121 can be coupled to embedded traces 4123 or embedded vias 4124. Inner terminals 4121 can comprise or be referred to as traces, bond fingers, or pads. Inner terminals 4121 can comprise copper, aluminum, gold, silver, nickel, palladium, or an alloy. In some examples, the thicknesses of inner terminals 4121 can range from approximately 3 µm to approximately 50 µm. Component interconnects 151 and 451 or substrate interconnects 4225 can be coupled to inner terminals 4121. Outer terminals 4122 can be provided on the outer side of dielectric structure 411 (e.g., on outer side 414 of substrate 41). Outer terminals 4122 can be exposed from the outer side of dielectric structure 411. Outer terminals 4122 can be coupled to embedded traces 4123 or embedded vias 4124. Outer terminals 4122 can be referred to as or comprise traces, pads, or ball lands. Outer terminals 4122 can comprise copper, aluminum, gold, silver, nickel, palladium, or an alloy. In some examples, the thicknesses of outer terminals 4122 can range from approximately 3 µm to approximately 50 µm.

Embedded traces 4123 can be provided extending in a substantially horizontal direction inside dielectric structure 411. Embedded traces 4123 can guide electrical connection paths in an approximately horizontal direction in dielectric structure 411, and can be coupled to inner terminals 4121, outer terminals 4122, or embedded vias 4124. In some examples, the thicknesses of embedded traces 4123 can range from approximately 3 µm to approximately 50 µm. Embedded vias 4124 can be provided extending in a substantially vertical direction inside dielectric structure 411. Embedded vias 4124 can guide electrical connection paths in an approximately vertical direction in dielectric structure 411, and can be coupled to inner terminals 4121, outer terminals 4122, or embedded traces 4123. In some examples, the thicknesses of embedded vias 4124 can range from approximately 3 µm to approximately 50 µm.

Substrate 41 can be a RDL substrate or a preformed substrate. In some examples, substrate 41 can be formed over encapsulant 43, substrate interconnects 4225, and electronic components 15 and 45. In some examples, substrate 41 can be formed and then provided over encapsulant 43, substrate interconnects 4225, and electronic components 15 and 45.

FIG. 8F shows a cross-sectional view of electronic device 40 at a later stage of manufacture. In the example shown in FIG. 8F, electronic components 16 and 17 can be provided. Electronic components 16 and 17 can be coupled to substrate outer side 414 of substrate 41. In some examples, component interconnects 161 of electronic component 16 and component interconnects 171 of electronic component 17 can be coupled to outer terminals 4122 of conductive structure 412. In some examples, each of electronic component 16 and electronic component 17 can comprise or be referred to as an EIC, a CDR, a PMIC, a DSP, a network processor, an audio processor, a wireless baseband system-on-chip processor, a sensor, an application specific integrated circuit, a memory, or an IPD. In some examples, electronic component 16 can be a CDR and electronic component 17 can be a PIC. In some examples, an underfill can be provided between electronic components 16 and 17 and substrate 41. In some examples, electronic component 16 can perform various arithmetic and control processing, store data, or remove noise from an electrical signal, and electronic component 17 can convert an electrical signal into an optical signal. Electronic component 17 can also convert an optical signal into an electrical signal, which may be provided to electronic component 15, 16, or 45. In some examples, ledge portion 174 of electronic component 17 can extend beyond the lateral side of encapsulant 43.

In accordance with various examples, outer interconnects 142 can be provided. Outer interconnects 142 can be coupled to outer terminals 4222 on outer side 424 of substrate 42.

Figure 8G:
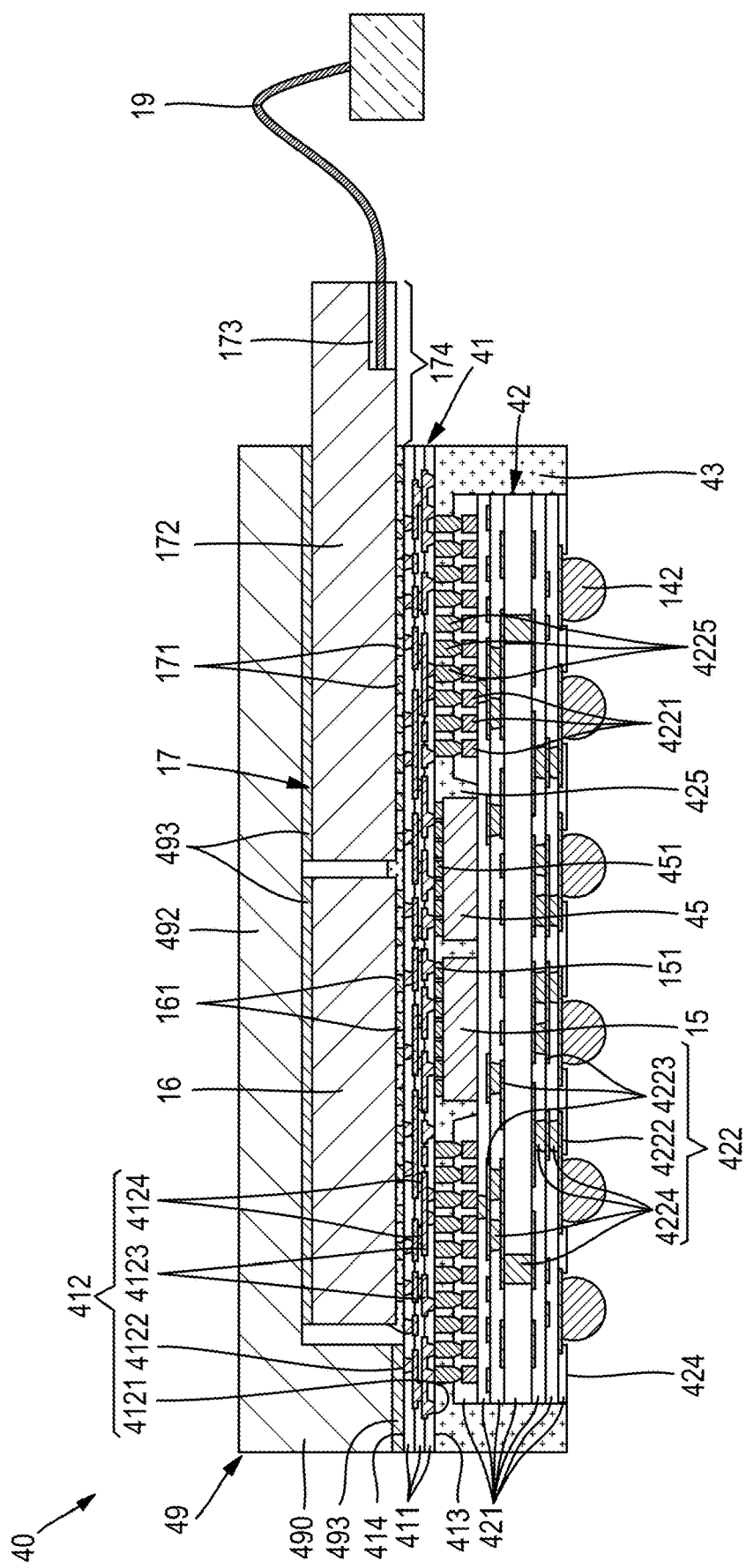

FIG. 8G shows a cross-sectional view of electronic device 40 at a later stage of manufacture. In the example shown in FIG. 8G, cover 49 can be provided. In some examples, cover 49 can comprise cover wall 490 and cover top 492. Cover wall 490 can be coupled to substrate 41 through interface material 493. Cover top 492 can extend from the cover wall 490 in a first direction (e.g., toward substrate 41) can be coupled to electronic components 16 and 17 through interface material 493. In some examples, cover 49 can comprise or be referred to as a lid, a shield, a heat sink, or a heat spreader. In some examples, cover 49 can comprise aluminum, copper, an aluminum-silicon-carbide (AlSiC) composite, or a copper-tungsten (CuW) composite. In some examples, the thickness of cover 49 can range from approximately 100 µm to approximately 1000 µm. Cover 49 can protect electronic components 16 and 17 from exposure to external elements or environments and can dissipate heat from electronic components 16 and 17. In some examples, interface material 493 can comprise or be referred to as a thermal interface material or an adhesive. Interface material can contact the back side of electronic component 16 and body 172 of electronic component 17 and can improve heat transfer between electronic components 16 and 17 and cover 49. Electronic device 40 of FIG. 8G is an example of a structure where a first substrate (e.g., substrate 41), a second substrate (e.g., substrate 42), a first inner component (e.g., electronic component 15/45), and an outer electronic component (e.g., electronic component 17) are in a stacked configuration with the first inner electronic component interposed between the first substrate and the second substrate. In addition, electronic device 40 of FIG. 8G is an example of a first inner electronic component (e.g., electronic component 15) and a second inner electronic component (e.g., electronic component 45) in a side-by-side configuration. Electronic components 15 and 45 are examples of inner electronic components and electronic components 16 and 17 are examples of outer electronic components.

In accordance with various examples, electronic device 40 can provide CPO, integrating electronic components 15, 45, and 16 with optical electronic component 17. Electronic components 15, 45, 16, and 17 can be coupled to one other by substrate 41. Substrate 41 can comprise a high-density RDL substrate 41, which can provide high-speed interfaces (e.g., short electrical signal paths) between optical electronic component 17 and electronic components 15, 45, and 16. A short electrical signal path can provide high speed switching, high performance, or reduced power loss. Additionally, cover 49 can improve thermal performance.

Figure 9:
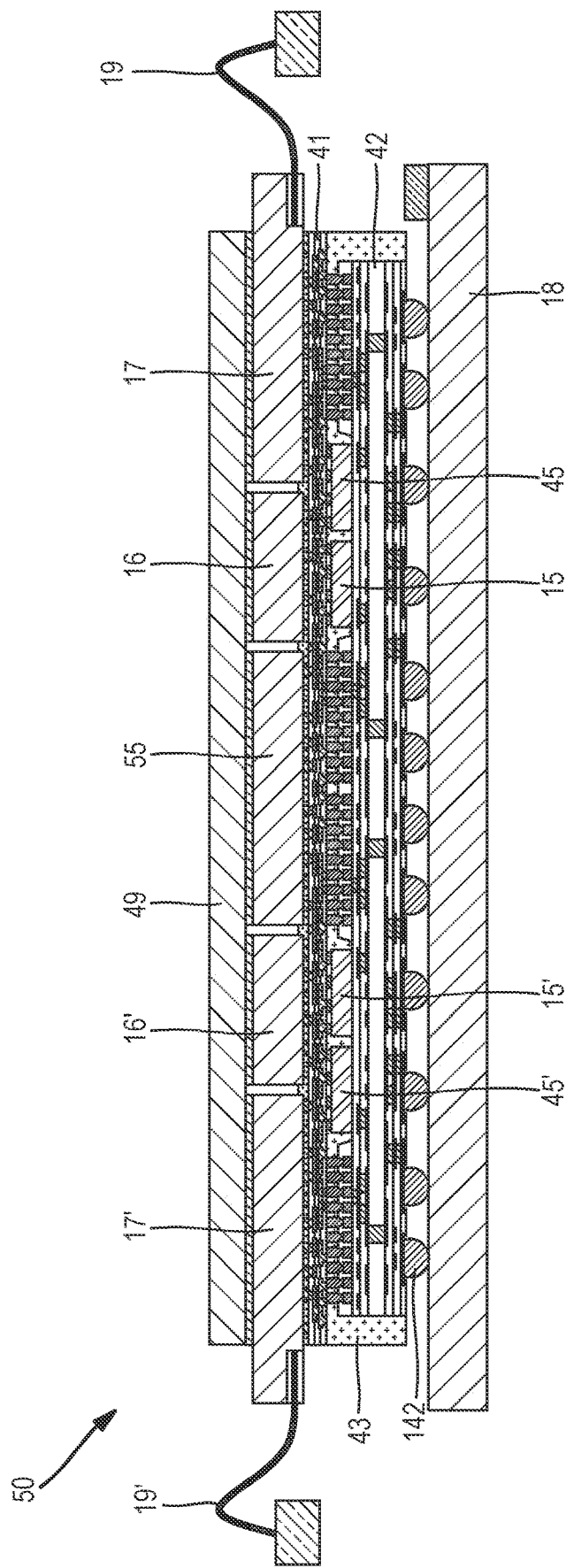
FIG. 9 shows a cross-sectional view of an example electronic device.

FIG. 9 shows a cross-sectional view of an example electronic device 50. In the example shown in FIG. 9, electronic device 50 can comprise substrate 41, substrate 42, encapsulant 43, electronic components 15 and 15', electronic components 16 and 16', electronic components 17 and 17', electronic components 45 and 45', electronic component 55, and cover 49. In some examples, electronic device 50 may also include optical interconnects 19 and 19'.

In some examples, electronic components 15 and 15', electronic components 16 and 16', and electronic components 45 and 45' can be coupled to substrate 41. In some examples, electronic component 55 can be coupled to substrate 41 and can comprise a switch die. In some examples, electronic components 17 and 17' can be coupled to substrate 41 and can each comprise a PIC. In some examples, electronic component 17 can be located proximate a first lateral side of electronic device 50 and electronic component 17' can be located proximate second lateral side of electronic device 50, opposite the first lateral side.

In some examples, electronic device 50 can include or can be coupled to a base substrate 18 through outer interconnects 142. In some examples, base substrate 18 can comprise or be referred to as switchbox printed circuit board and can be configured to integrate a CPO with an ethernet switch, thereby constructing a hyper-scale data center at low cost.

Figure 10:
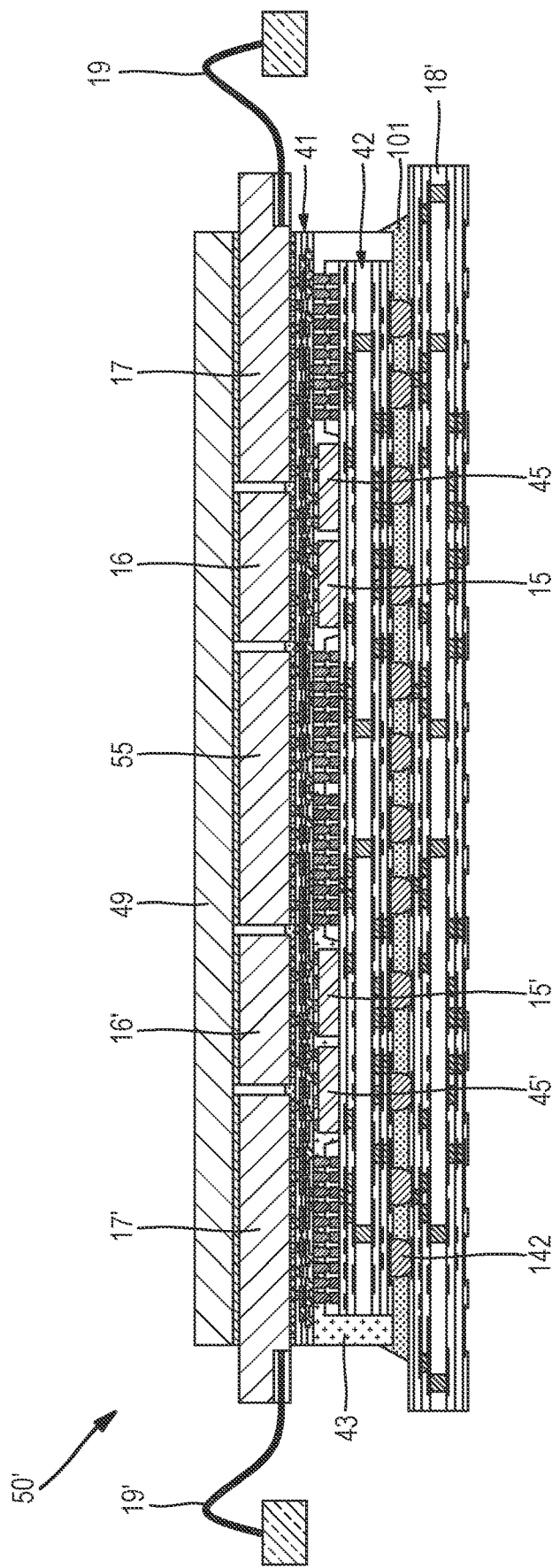
FIG. 10 shows a cross-sectional view of an example electronic device.

FIG. 10 shows a cross-sectional view of an example electronic device 50'. In the example shown in FIG. 10, electronic device 50' can include or be coupled to base substrate 18'. In some examples, base substrate 18' can comprise or be referred to as a high-density interconnection (HDI) substrate. In some examples, underfill 101 can be provided between substrate 42 and base substrate 18'. In some examples, base substrate 18' be a preformed substrate comprising a 4-layer to 20-layer structure, which can include laser via holes, stacked vias, buried via holes, plated through holes, copper clad laminates, prepregs, or copper foils. In this regard, employing an HDI base substrate 18' can help in the implementation of multi-CPO.

Electronic device 50 of FIG. 9 and electronic device 50' of FIG. 10 are examples of structures where a first substrate (e.g., substrate 41), a second substrate (e.g., substrate 42), a first inner component (e.g., electronic component 15/15'/45/45'), and an outer electronic component (e.g., electronic component 17) are in a stacked configuration with the first inner electronic component interposed between the first substrate and the second substrate. In addition, electronic devices 50 and 50' are illustrate examples of a first inner electronic component (e.g., electronic component 15/15') and a second inner electronic component (e.g., electronic component 45/45') in a side-by-side configuration. Electronic components 15, 15', 45, and 45' are examples of inner electronic components and electronic components 16, 16', 17, 17' and 55 are examples of outer electronic components.

The present disclosure includes reference to certain examples, however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

What is claim is:

1. An electronic device, comprising:
a first substrate comprising a first substrate first side, a first substrate second side opposite the first substrate first side, a first dielectric structure, and a first conductive structure;
a second substrate comprising a second substrate first side and a second substrate second side opposite the second substrate first side;
a first inner electronic component coupled to the first conductive structure proximate to the first substrate second side;
an outer electronic component coupled to the first conductive structure proximate to the first substrate first side, the outer electronic component comprising:
a body; and
a groove in the body configured to couple with an external interconnect; and
inner interconnects coupling the first substrate to the second substrate;
wherein:
the first substrate, the second substrate, the first inner electronic component, and the outer electronic component are in a stacked configuration;
the first inner electronic component is interposed between the first substrate and the second substrate;
the first substrate comprises an outer edge;
a portion of the body extends past the outer edge to define a ledge portion; and
the groove is in the ledge portion.

2. The electronic device of claim 1, wherein:
the second substrate comprises a second dielectric structure and a second conductive structure.

3. The electronic device of claim 1, further comprising:
a second inner electronic component proximate to the first inner electronic component interposed between the first substrate and the second substrate.

4. The electronic device of claim 3, wherein:
the second inner electronic component is coupled to the first conductive structure; and
the second inner electronic component is proximate to the first inner electronic component in a side-by-side configuration.

5. The electronic device of claim 3, wherein:
the second inner electronic component is coupled to the second substrate; and
the first inner electronic component is positioned above and vertically overlaps the second inner electronic component.

6. The electronic device of claim 1, further comprising:
a cavity extending partially inward from the first substrate second side;
wherein:
the first inner electronic component is located within the cavity.

7. The electronic device of claim 1, further comprising:
an encapsulant interposed between the first substrate and the second substrate, wherein:
the encapsulant contacts the first inner electronic component and the inner interconnects.

8. The electronic device of claim 1, wherein:
the body comprises a footprint greater than that of the first substrate; and
the inner interconnects are external to the first inner electronic component.

9. The electronic device of claim 1, wherein:
the outer electronic component comprises an optical component.

10. The electronic device of claim 9, wherein:
the external interconnect comprises an optical interconnect.

11. The electronic device of claim 1, further comprising:
a cover coupled to the outer electronic component.

12. An electronic device, comprising:
a first substrate comprising a first substrate inner side, a first substrate outer side opposite the first substrate inner side, a first substrate edge, a first dielectric structure, and a first conductive structure;
a second substrate comprising a second substrate inner side, a second substrate outer side opposite the second substrate inner side, a second dielectric structure, and a second conductive structure;
a first electronic component comprising a first active side and a first back side opposite to the first active side, the first active side coupled to the first conductive structure proximate to the first substrate inner side;
a second electronic component comprising a second active side and a second back side opposite to the second active side, the second electronic component adjacent to the first electronic component;
an optical component coupled to the first conductive structure adjacent to the first substrate outer side, the optical component comprising:
a body;
a ledge portion that extends beyond the first substrate edge; and
a wave guide in the ledge portion; and
inner interconnects coupling the first substrate inner side to the second substrate inner side;
wherein:
the optical component, the first substrate, and the second substrate are in a stacked configuration; and
the first electronic component and the second electronic component are interposed between the first substrate and the second substrate.

13. The electronic device of claim 12, wherein:
the second conductive structure comprises inner terminals proximate to the second substrate inner side;
the inner interconnects are coupled to the inner terminals;
the inner interconnects are protruded from the second dielectric structure; and
the first back side of the first electronic component and the second back side of the second electronic component are coupled to the second substrate inner side.

14. The electronic device of claim 12, further comprising:
first component interconnects coupled to the first active side of the first electronic component;
second component interconnects coupled to the second active side of the second electronic component; and an encapsulant contacting the first electronic component, the second electronic component, and the inner interconnects;

wherein:
- the encapsulant comprises a top side; and
- the first component interconnects, the second component interconnects, and the inner interconnects are exposed from the top side of the encapsulant.

15. The electronic device of claim 14, wherein:
the first substrate comprises a redistribution layer (RDL) substrate formed over the top side of the encapsulant; and
the first conductive structure is coupled to the first component interconnects, the second component interconnects, and the inner interconnects.

16. The electronic device of claim 14, further comprising:
a cavity extending inward from the second substrate inner side;

wherein:
- the first back side of the first electronic component and the second back side of the second electronic component are coupled to the second substrate within the cavity.

17. The electronic device of claim 12, wherein:
the wave guide is configured to couple with an optical interconnect.

18. The electronic device of claim 12, further comprising:
a cover coupled to the optical component.

19. A method of manufacturing an electronic device, comprising:
providing a first substrate comprising a first substrate inner side, a first substrate outer side opposite the first substrate inner side, a first substrate edge, a first dielectric structure, and a first conductive structure;
providing a second substrate comprising a second substrate inner side, a second substrate outer side opposite the second substrate inner side, a second dielectric structure, and a second conductive structure;
providing a first electronic component comprising a first active side;
coupling the first active side to the first conductive structure adjacent to the first substrate inner side;
coupling the first substrate inner side to the second substrate inner side with inner interconnects; and
coupling an optical component to the first conductive structure adjacent to the first substrate outer side, the optical component comprising:
- a body;
- a ledge portion that extends beyond the first substrate edge; and
- a wave guide in the ledge portion and configured to couple with an optical interconnect;

wherein:
- the optical component, the first substrate and the second substrate are in a stacked configuration; and
- the first electronic component is interposed between the first substrate and the second substrate.

20. The method of claim 19, further comprising:
providing a second electronic component comprising a second active side;
coupling the second active side to one of the first substrate inner side or the second substrate inner side; and
providing an encapsulant interposed between the first substrate inner side and the second substrate inner side, wherein:
- the encapsulant contacts the first electronic component, the second electronic component, and the inner interconnects.

* * * * *